United States Patent
Sato

(10) Patent No.: US 7,336,270 B2
(45) Date of Patent: Feb. 26, 2008

(54) DISPLAY DEVICE AND ELECTRONIC APPARATUS

(75) Inventor: Takashi Sato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 538 days.

(21) Appl. No.: 10/781,731

(22) Filed: Feb. 20, 2004

(65) Prior Publication Data
US 2004/0189625 A1 Sep. 30, 2004

(30) Foreign Application Priority Data

| Mar. 14, 2003 | (JP) | ............................ 2003-069892 |
| Mar. 14, 2003 | (JP) | ............................ 2003-069893 |
| Dec. 26, 2003 | (JP) | ............................ 2003-433414 |

(51) Int. Cl.
*G09G 5/00* (2006.01)

(52) U.S. Cl. ...................... 345/204; 345/205; 345/206

(58) Field of Classification Search .................. 345/55, 345/80, 81, 204–206, 87; 315/169.1–169.4; 368/82; 438/455, 14, 458; 340/572.1, 928; 235/492, 491, 380; 257/99, 679; 349/152; 434/317; 428/202; 705/12; 313/504
See application file for complete search history.

(56) References Cited

U.S. PATENT DOCUMENTS

| 4,232,512 | A  | * | 11/1980 | Yoshikawa et al. ............ 368/82 |
| 6,197,663 | B1 | * | 3/2001  | Chandross et al. .......... 438/455 |
| 6,223,990 | B1 | * | 5/2001  | Kamei ......................... 235/492 |
| 6,249,227 | B1 | * | 6/2001  | Brady et al. .............. 340/572.1 |
| 6,343,744 | B1 | * | 2/2002  | Shibata et al. ............... 235/492 |
| 6,465,880 | B1 | * | 10/2002 | Dobashi et al. ............. 257/679 |
| 6,764,001 | B1 | * | 7/2004  | Kawai et al. ................ 235/380 |
| 6,850,780 | B1 | * | 2/2005  | Gioscia et al. .............. 455/566 |
| 6,863,219 | B1 | * | 3/2005  | Jacobsen et al. ............. 235/492 |
| 6,876,143 | B2 | * | 4/2005  | Daniels ....................... 313/504 |
| 6,897,933 | B2 | * | 5/2005  | Hoshina ...................... 349/152 |
| 6,975,832 | B2 | * | 12/2005 | Adams et al. ............... 434/317 |
| 7,060,953 | B2 |   | 6/2006  | Ishikawa et al. |
| 7,071,629 | B2 | * | 7/2006  | Russ et al. ................ 315/169.3 |
| 2001/0003445 | A1 | * | 6/2001 | Gauther et al. ................ 345/87 |
| 2002/0088986 | A1 | * | 7/2002 | Kayama et al. ................ 257/99 |
| 2002/0190364 | A1 | * | 12/2002 | Dobashi et al. ............. 257/679 |
| 2003/0016178 | A1 |   | 1/2003 | Byun et al. |
| 2003/0022403 | A1 | * | 1/2003 | Shimoda et al. ............... 438/14 |

(Continued)

FOREIGN PATENT DOCUMENTS

JP          A-07-020421          1/1995

(Continued)

*Primary Examiner*—Prabodh Dharia
(74) *Attorney, Agent, or Firm*—Oliff & Berridge, PLC

(57) ABSTRACT

To provide a display device and an electronic apparatus including a radio communication device, an embodiment of the radio communication device being an IC tag, which do not need a special space to attach the IC tag and is capable of reducing the amount of time and effort required for attaching the IC tag, a display device including a radio communication device having at least one substrate provided with a display unit and display-unit-driving wiring lines 9 and 10, a communication integrated-circuit unit, and an antenna is provided. At least a part of the antenna is formed on the substrate and formed of a conductor formed in the same layer as a conductor that constitute the display unit or conductors that constitute the display-unit-driving wiring lines.

28 Claims, 16 Drawing Sheets

U.S. PATENT DOCUMENTS

| | | |
|---|---|---|
| 2004/0024635 A1* | 2/2004 | McClure et al. ............ 705/12 |
| 2004/0041800 A1* | 3/2004 | Daniels ..................... 345/204 |
| 2004/0097005 A1* | 5/2004 | Daniels ..................... 438/99 |
| 2004/0161592 A1* | 8/2004 | Yoshida et al. ............ 428/202 |
| 2004/0206814 A1* | 10/2004 | Kawai et al. .............. 235/380 |
| 2005/0088079 A1* | 4/2005 | Daniels ..................... 313/504 |
| 2005/0106839 A1* | 5/2005 | Shimoda et al. ........... 438/458 |
| 2005/0199731 A9* | 9/2005 | Empedocles et al. ....... 235/491 |
| 2006/0001552 A1* | 1/2006 | Kojima ..................... 340/928 |
| 2007/0014916 A1* | 1/2007 | Daniels ..................... 427/66 |

FOREIGN PATENT DOCUMENTS

| | | |
|---|---|---|
| JP | A-08-276458 | 10/1996 |
| JP | A-09-105895 | 4/1997 |
| JP | A 2000-57293 | 2/2000 |
| JP | A-2000-138512 | 5/2000 |
| JP | A-2001-298519 | 10/2001 |
| JP | A-2001-319043 | 11/2001 |
| JP | A-2002-033481 | 1/2002 |
| JP | A-2002-40472 | 2/2002 |
| JP | A-2002-142356 | 5/2002 |
| JP | A-2002-157569 | 5/2002 |
| JP | A-2002-169134 | 6/2002 |
| JP | A-2002-215749 | 8/2002 |
| JP | A-2002-236891 | 8/2002 |
| JP | A-2002-268042 | 9/2002 |
| JP | A-2002-269479 | 9/2002 |
| JP | A-2002-269508 | 9/2002 |
| JP | A-2002-312748 | 10/2002 |
| JP | A-2002-328591 | 11/2002 |
| JP | A-2003-006599 | 1/2003 |
| TW | 269028 | 1/1994 |

* cited by examiner

FIG. 14
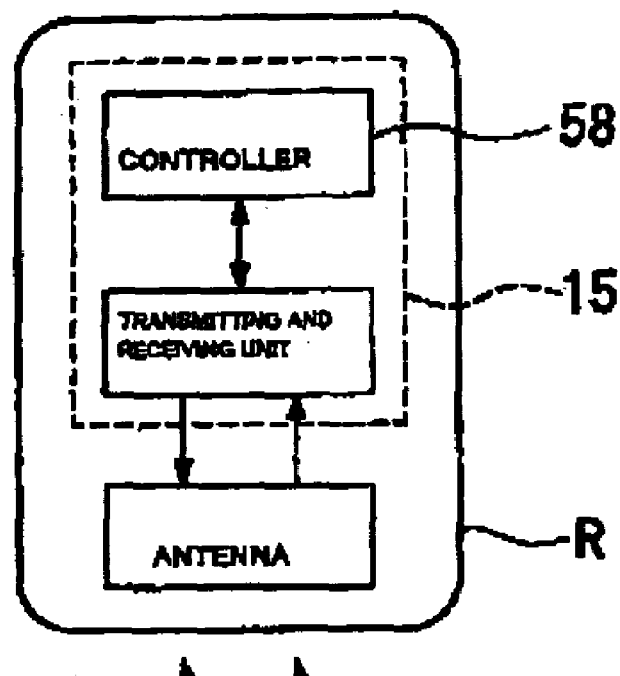
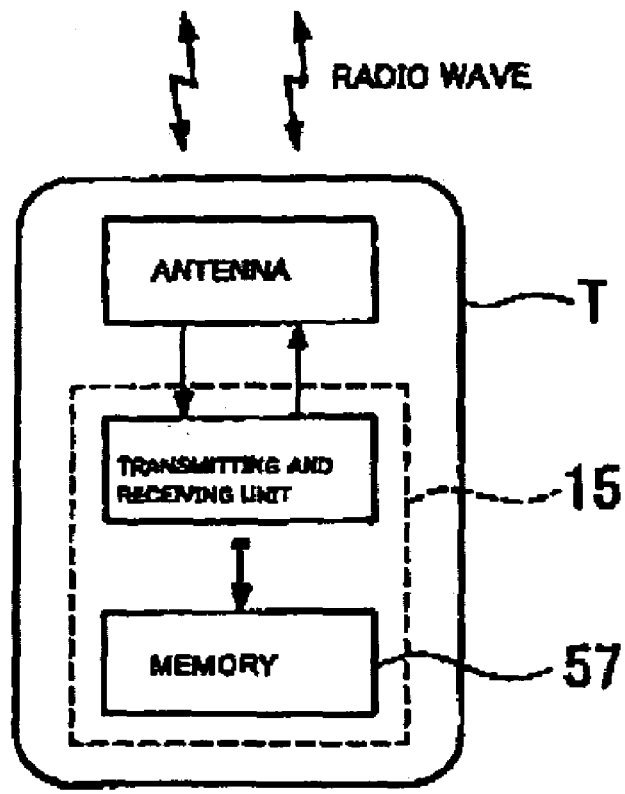

F I G. 1 5
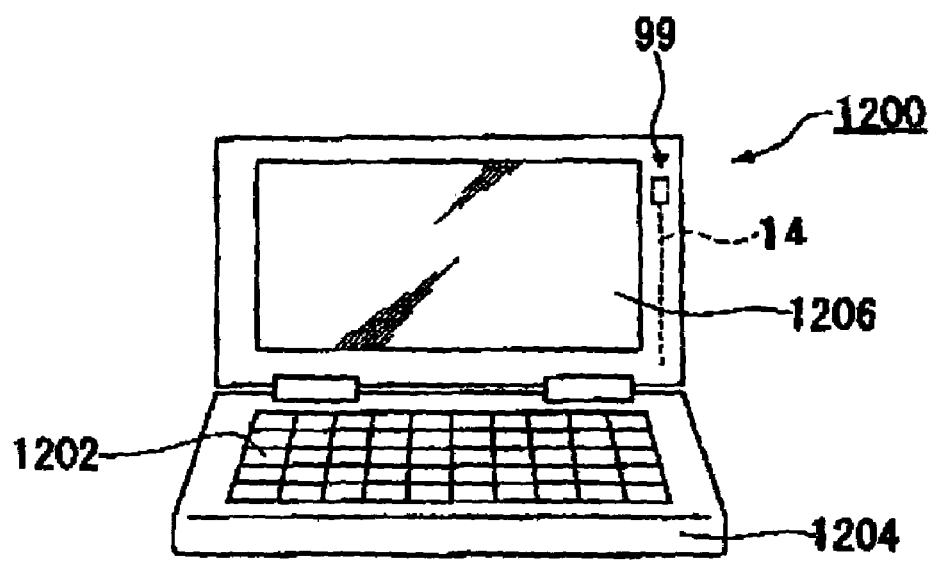

DISPLAY DEVICE AND ELECTRONIC APPARATUS

BACKGROUND OF THE INVENTION

1. Field of Invention

The present invention relates to a display device including a radio communication device and an electronic apparatus.

2. Description of Related Art

A production method to obtain a plurality of liquid crystal cell patterns, in which the plurality of liquid crystal cell patterns are simultaneously formed on one mother board, two mother boards are attached to each other, and the mother boards are divided into individual cells, has been adopted for a display device, such as a liquid crystal display. Japanese Unexamined Patent Application Publication No. 2002-268042. The production method is extremely effective. However, according to the production method, after dividing the mother boards into individual cells, many additional processes, such as connection of a driving flexible printed circuit (hereinafter "FPC") must be performed before a complete liquid crystal module product is provided. In particular, after dividing the mother boards into individual cells, it is difficult to let each product have product identification information, such as a lot number, a mother board number, and a product number and product record information, such as a manufacturing factory and the date of manufacture. Therefore, for example, production line workers manage products and processes by recording product information. Such complicated product and process management procedures affect distribution processes as well as production processes.

SUMMARY OF THE INVENTION

As a method of effectively managing products and inventory, barcodes are used as information recording media in a related art technology. According to the method, when the barcodes are attached to products, various information items can be simply read by a reader to thus manage information using a computer. Further, radio communication devices (information recording media) using a RFID (radio frequency identification) technology, which are referred to as IC tags and RFID tags, have recently attracted attention as an alternative to barcodes. The IC tags can perform communications between readers and writers without contact and can manage products and inventory by exchanging information items in the memories mounted in the IC tags. Also, the IC tags are superior to barcodes in that information items can be added or changed at any time.

For example, when an IC tag is desired to be used for the product and process management of a liquid crystal display device, it is necessary to attach an IC tag that includes an IC chip and an antenna outside the display area of the liquid crystal display device. Since liquid crystal display devices are being miniaturized with each succeeding design, in the liquid crystal display device, the area of the peripheral edge (a frame region or an abandoned region) outside the display area is small. Also, liquid crystal display devices that can be curved are available and glass substrates that constitute liquid crystal display devices become thinner. The typical size of a liquid crystal display device, the width of a peripheral edge, is 2 mm or less, and the thickness of a glass substrate is 0.4 mm or less. According to an example of the size of an IC tag, the typical size of an IC chip is 1 mm×1 mm and the length of an antenna is several cm. In such an environment, there may be no space to attach an IC tag to a liquid crystal display device or, even if there is a space for attaching an IC tag to a liquid crystal display device, it requires a great amount of effort and takes a long time to attach a slim IC tag to the space. Therefore, IC tags are not currently used to manage products and processes in liquid crystal display devices. This is a common problem in other display devices as well as liquid crystal display devices.

Liquid crystal display devices are mounted in electronic apparatus, such as television sets, PC monitors, car navigation devices, and digital cameras, which are finally distributed to markets as final products. In this case, it is necessary to let the final products, such as television sets, have product record information or product identification information. When the IC tags are used, it is necessary to attach the IC tags to the cases of the television sets. Then, it is necessary to perform processes of attaching the IC tags during both of the manufacturing processes of the liquid crystal display devices and the manufacturing processes of the television sets, which require a great amount of effort and take a long time. This is a common problem in various electronic apparatus including other display devices as well as liquid crystal display devices.

In order to address the above problems, the present invention provides display devices and electronic apparatus including radio communication devices, such as IC tags, which do not require special spaces to attach the same and which are capable of reducing the amount of effort and time to attach the same.

In order to achieve the above, a display device according to an aspect of the present invention includes at least one substrate provided with a display unit and display-unit-driving wiring lines and a radio communication device having a communication integrated-circuit unit and an antenna, at least a part of the antenna formed on the substrate and formed of a conductor formed in the same layer as a conductor that constitutes the display unit or conductors that constitute the display-unit-driving wiring lines.

Another display device according to an aspect of the present invention is characterized in that at least a part of the antenna is formed on the substrate and is formed of a conductor made of the same material as a conductor that constitutes the display unit or conductors that constitute the display-unit-driving wiring lines.

Another display device according to an aspect of the present invention is characterized in that at least a part of the antenna is formed on the substrate and is formed of a conductor formed by the same process as a conductor that constitutes the display unit or conductors that constitute the display-unit-driving wiring lines.

The radio communication device, such as an IC tag, includes a communication integrated circuit and an antenna. The communication integrated circuit has a complicated circuit structure. However, the antenna has a simple structure in which the same is constituted of one line having predetermined width and length. Therefore, the present inventor invented a structure in which the antenna is directly formed on a substrate that constitutes the display device. Also, he paid attention to the fact that a conductor that constitutes various electrodes and switching elements in the display unit or a conductor that constitutes various wiring lines for driving the display unit exists on the substrate of the display device. He also decided to form at least a part of the antenna on the same layer, of the same material, and by the same process as those of the conductor without using a common substrate manufacturing process. According to this structure, since it is possible to form at least a part of the antenna in an arbitrary position where patterns, such as the display unit, do not exist, it is not necessary to provide a special space to attach the antenna. Also, since it is possible to form at least a part of the antenna during a common manufacturing process, it is possible to reduce the amount of effort and time to attach the antenna.

The radio communication device may have a function of storing information concerning the corresponding display device. Further, the radio communication device may have at least one of a function of writing information in a radio communication device other than the corresponding display device and a function of reading information from the radio communication device other than the corresponding display device. Furthermore, the radio communication device may have a function of storing at least one of information written in a radio communication device other than the corresponding display device and information of the radio communication device other than the corresponding display device.

That is, "the radio communication device" according to an aspect of the present invention may function as an information storage medium to store information concerning a corresponding display device, for example, product identification information, such as a lot number, a mother board number, and a product number and product record information, such as a manufacturing factory and the date of manufacture. The radio communication device according to an aspect of the present invention may function as a reader/writer to write the above information to another information storage medium constituted of the radio communication device and reading the information stored in the information storage medium. The radio communication device according to an aspect of the present invention may store the information written in the information storage medium constituted of the radio communication device and read from the information storage medium by the radio communication device. At any rate, the structure of the antenna is common. The radio communication device may have one of the two functions according to the structure of the communication integrated circuit.

An aspect of the present invention is characterized in that at least a part of the antenna is formed on the substrate. However, a few forms of the communication integrated circuit exist. For example, there exist (1) a form in which the communication integrated circuit is mounted on the substrate, (2) a form in which the communication integrated circuit is mounted on an external substrate when the external substrate for driving the display unit, such as an FPC on which a driving IC and mounted is connected to the substrate and (3) a form in which the communication integrated circuit is directly formed on the substrate.

The structure of form (1) is that a separate communication integrated-circuit unit, such as an IC chip, is mounted on the substrate. According to such a structure, it is possible to easily mount the radio communication device on the substrate by mounting the separate communication integrated circuit on the substrate. Since the entire radio communication device is arranged on the substrate, when the communication integrated circuit is mounted on the substrate after the substrate is completed, it is possible to manage products and processes by using the radio communication device before the external substrate for driving the display unit is connected to the substrate.

In the structure of form (1), it is necessary to electrically connect the communication integrated circuit to the antenna.

In order to the communication integrated-circuit unit and the antenna, it is possible to electrically connect to each other through the conductor formed in the same layer as the conductor that constitutes the display unit or the conductors that constitute the display-unit-driving wiring lines. That is, like the antenna, the conductor to electrically connecting the communication integrated circuit to the antenna may be formed of the conductor on the same layer as the conductor that constitutes the display unit or the display-unit-driving wiring lines.

According to this structure, since it is possible to simultaneously form the conductor to electrically connect the communication integrated circuit to the antenna and the other conductors on the substrate, it is possible to limit the number of processes and to reduce or prevent manufacturing processes from being complicated. Therefore, it is possible to reasonably connect the communication integrated circuit to the antenna.

In the structure of form (2), the external substrate for driving the display unit is electrically connected to the substrate and the communication integrated circuit is mounted on the external substrate. In this case, an external substrate for driving the display unit is electrically connected to the substrate and a conductor provided on the external substrate is electrically connected to the antenna formed on the substrate so that the conductor on the external substrate and the antenna on the substrate constitute an entire antenna.

According to this structure, for example, even when the substrate of the display device is small and the antenna formed on the substrate is not long enough, it is possible to compensate for the inadequate of the length of the antenna with the additional length of the conductor on the external substrate and to thus obtain an antenna having a desired performance. Therefore, it is possible to increase the degree of freedom in designing the antenna. Since many wiring lines are originally provided in the external substrate for driving the display unit, it is not burdensome to additionally provide an antenna conductor on the external substrate.

In the structure of form (2), the external substrate includes a plurality of external substrates and the communication integrated-circuit unit is mounted on one of the plurality of external substrates.

The driving substrate (a first external substrate), such as the FPC, may be connected to the substrate of the display device. The driving substrate may be connected to another circuit substrate (a second external substrate), such as a printed wiring line board. "The plurality of external substrates" according to an aspect of the present invention includes such a substrate. According to the above structure, the communication integrated circuit may be mounted on either the first external substrate or the second external substrate. In the above case, when the communication integrated circuit is mounted on the second external substrate, an entire antenna may be constituted of the antenna on the substrate, the conductor on the first external substrate, and the conductor on the second external substrate.

In the structure of form (3), the communication integrated-circuit unit includes a plurality of semiconductor elements formed on the substrate.

According to this structure, it is not necessary to provide an additional communication integrated circuit formed of an IC chip and to mount the communication integrated circuit on the substrate.

In the structure of form (3), the plurality of semiconductor elements that constitute the communication integrated circuit may have the same structure as another semiconductor element formed on the substrate.

A pixel switching semiconductor element of the display unit and a semiconductor element that constitutes a display unit driving circuit may be formed on the substrate of the display device. In such a case, when the semiconductor elements that constitute the communication integrated circuit have the same structure as that of the other semiconductor elements, it is possible to simultaneously form the above-mentioned semiconductor elements. As a result, it is possible to limit the number of processes and to reduce or prevent the manufacturing processes from being complicated.

At least a part of the antenna may be any position on the substrate. It is preferable that at least a part of the antenna be formed on the substrate in a region excluding the display unit, for example be formed along one peripheral edge of the substrate.

According to this structure, it is possible to arrange the antenna using the peripheral edge (the frame region) of the substrate that originally has a space without deteriorating the display.

When the conductor is formed above the antenna on the substrate to constitute the corresponding display device, according to an aspect of the invention the conductor may overlap the antenna in plan view. In short, the conductor may not exist above the antenna.

Even if the conductor exists above the antenna, since radio waves circulate and reach the antenna, communications can be performed. However, when the conductor exists above the antenna, part of the radio waves may be shielded. Therefore, in order to correctly perform the communications, the conductor may not exist above the antenna.

A display device according to an aspect of the present invention includes at least one substrate provided with a display unit and display-unit-driving wiring lines, and a radio communication device having a communication integrated-circuit unit and an antenna, and is characterized in that at least a part of the radio communication device is directly formed on the substrate.

According to this structure, it is possible to realize a display device that does not require a special space to provide the radio communication device and that is capable of reducing the amount of time and effort required to provide the radio communication device.

An electronic apparatus according to an aspect of the present invention includes the above display device according to an aspect of the present invention.

According to this structure, it is possible to easily manage products and processes and to realize an electronic apparatus including a display device that can be used as an information writing/reading device.

An electronic apparatus according to an aspect of the present invention includes the above display device according to an aspect of the present invention and a charging unit electrically connected to the antenna of the radio communication device through a rectifying unit to control the flow of the current in one direction, the antenna is used as an antenna to charge power into the charging unit from the outside using electromagnetic induction.

According to this structure, since it is possible to store the current caused by electromagnetic induction within the antenna of the radio communication device in the charging unit, it is possible to supply power to the electronic apparatus and to charge the electronic apparatus without connecting the electronic apparatus to an external power source. Therefore, since it is possible to supply power to the electronic apparatus and to charge the electronic apparatus without using a dedicated charger for the corresponding electronic apparatus, it is possible to address the disadvantage that it is not possible to charge the electronic apparatus without the dedicated charger for the electronic apparatus.

Since a rectifying unit is arranged between the antenna and the charging unit, the charging unit is always charged with current from the same direction so that the charging unit is effectively charged.

The electronic apparatus according to an aspect of the present invention includes another apparatus excluding the display device electrically connected to the charging unit, the other apparatus driven by the power charged in the charging unit.

According to this structure, it is possible to drive the other devices of the electronic apparatus by the power of the charging unit that can be charged without being connected to the external power source. Therefore, since it is possible to supply power to the electronic apparatus and to drive the electronic apparatus without using the dedicated charger for the corresponding electronic apparatus, it is possible to address the disadvantage that it is not possible to charge and drive the electronic apparatus without the dedicated charger for the electronic apparatus.

An electronic apparatus including a first display device and a second display device, the second display device is the display device according to an aspect of the present invention and is provided on the surface opposite to the surface on which the first display device is provided.

According to this structure, since the second display device provided with the radio communication device is provided on the surface opposite to the first display device, the radio communication device provided in the second display device can correctly write and read information in a state where the image displayed on the first display device is visualized. In short, since the second display device faces the outside in the above-mentioned state, it is possible to reduce or prevent the case of the electronic apparatus from shielding the radio waves emitted from the radio communication device and to correctly write and read information.

It is preferable that the first display device display at least one of information written in a radio communication device other than the corresponding display device by the second display device and information read from the radio communication device other than the corresponding display device by the second display device.

According to this structure, the radio communication device, included in the second display device, can display at least one of the information written in a radio communication device other than the corresponding display device and the information read from a radio communication device other than the corresponding display device, on the first display device.

Therefore, it is possible to check the information written in the radio communication device and the information read from the radio communication device without changing the direction of the electronic apparatus and to thus instantaneously check the information written in the radio communication device and the information read from the radio communication device.

It is preferable that the first display device store and display at least one of information written in a radio communication device other than the corresponding display device by the second display device and information read from the radio communication device other than the corresponding display device by the second display device.

According to this structure, the radio communication device, included in the second display device, can store at least one of the information written in a radio communication device other than the corresponding display device and the information read from a radio communication device other than the corresponding display device and can display the same on one display device. Therefore, it is possible to display the information written in the radio communication device and the information read from the radio communication device on the display device and to check the same later.

The same information as the information once written in a radio communication device, other than the corresponding display device, can be repeatedly written in still another radio communication device. The information read from a radio communication device, other than the corresponding display device and stored in the display device, can be written in still another radio communication device.

The electronic apparatus according to an aspect of the present invention includes the display device according to an aspect of the present invention, and the display device displays at least one of the information written in a radio communication device other than the corresponding display device and the information read from the radio communication device other than the corresponding display device.

According to this structure, the radio communication device, included in the display device, can display at least one of the information written in a radio communication device other than the corresponding display device and the information read from a radio communication device other than the corresponding display device on the display device. Therefore, it is possible to check the information written in the radio communication device and the information read from the radio communication device.

The electronic apparatus according to an aspect of the present invention includes the display device according to an aspect of the present invention, and the display device stores and displays at least one of information written in a radio communication device other than the corresponding display device and information read from the radio communication device other than the corresponding display device.

According to this structure, the radio communication device, included in the display device, can store at least one of the information written in a radio communication device other than the corresponding display device and the information read from a radio communication device other than the corresponding display device and can display the same on one display device. Therefore, it is possible to display the information written in the radio communication device and the information read from the radio communication device on the display device and to check the same later.

The same information as the information once written in a radio communication device, other than the corresponding display device, can be repeatedly written in still another radio communication device. The information read from a radio communication device, other than the corresponding display device and stored in the display device, can be written in still another radio communication device.

At least a part of one surface and the other surface of the display device may be exposed to the outside.

According to this structure, at least a part of one surface of the display device and at least a part of the other surface are exposed to the outside. Therefore, for example, when one surface is a display surface, the image displayed on the one surface can be visualized from the exposed part of that surface and the radio communication device can write information in the exposed part of the other surface and can read information from the exposed part of the other surface. That is, it is possible to reduce the possibility of or prevent the case of the electronic apparatus from disturbing the writing and reading of information by the radio communication device.

The radio communication device, included in the display device, can display the information written in the exposed part of the other surface and the information read from exposed the part of the other surface, on one surface of the display device. Therefore, it is possible to check the information written in the exposed part of the other surface and the information read from the exposed part of the other surface, without changing the direction of the electronic apparatus and to thus instantaneously check the information written in the exposed part of the other surface and the information read from the exposed part of the other surface.

The display device may be a display device capable of displaying images on any of the one surface and the other surface of the display device.

According to this structure, regardless of the direction of the electronic apparatus, it is possible to check the information written to the other surface, and the information read from the other surface without changing the direction of the electronic apparatus and to thus instantaneously check the information written to the other surface and the information read from the other surface. In short, it is possible to display the information written to the other surface and the information read from the other surface by the radio communication device in one surface. It is possible to display the information written to one surface and the information read from one surface by the radio communication device on the other surface.

The radio communication device, other than the corresponding display device, reads information concerning the corresponding electronic apparatus from the radio communication device and writes information concerning the corresponding electronic apparatus in the radio communication device as data.

According to this structure, a radio communication device, other than the corresponding display device, can write the information in and read the information from, the radio communication device. Therefore, it is possible to newly add the information and to read the written information.

The radio communication device may be driven by radio waves input to the antenna from the outside.

According to this structure, the radio communication device can read and write the information concerning the electronic apparatus as data without receiving power from the electronic apparatus. Therefore, it is possible to simplify the structure of the electronic apparatus and to reduce the power consumption of the electronic apparatus.

The radio communication device may be provided with a power source unit which is electrically connected and driven by the power of the power source unit.

According to this structure, the radio communication device can read and write the information concerning the electronic apparatus as data by emitting radio waves using the power of the power source. Therefore, the radio communication device without the power source can operate by itself to thus read and write the information concerning the electronic apparatus as data. As a result, it is possible to enlarge objects in which data is written and from which data is read.

The information concerning the corresponding electronic apparatus may be rewritten in the radio communication device as data.

According to this structure, since it is possible to convert the information concerning the electronic apparatus into data, information concerning the latest electronic apparatus is written in the radio communication device. Since the data is changed, it is possible to reduce or prevent the region of the radio communication device, in which data is written, from being filled and to change and update the data unlimited number of times.

The radio communication device includes a writing unit to write information concerning the corresponding electronic apparatus as data and a rewritable region and a non-rewritable region are provided in the writing unit.

According to this structure, a rewritable region and a non-rewritable region are provided in the writing unit. Therefore, the unchangeable information concerning the electronic apparatus including product identification information, such as a lot number and a product number, a manufacturing factory, and the date of manufacture is written in the non-rewritable region to thus write records on the electronic apparatus in the rewritable region. Since the unchangeable information concerning the electronic apparatus is written in the non-rewritable region, it is possible to reduce the chance or prevent the unchangeable information from being erroneously changed.

Another electronic apparatus according to an aspect of the present invention includes a display device including at least one substrate provided with a display unit and display-unit-driving wiring lines, and a radio communication device having a communication integrated-circuit unit and an antenna, and is characterized in that at least a part of the antenna is formed on the substrate of the display device and is formed of a conductor formed in the same layer as a conductor that constitutes the display unit or conductors that constitute the display-unit-driving wiring lines, and information concerning the corresponding electronic apparatus is written in the radio communication device as data.

Another electronic apparatus according to an aspect of the present invention is characterized in that at least a part of the antenna is formed on the substrate of the display device and is formed of a conductor made of the same material as a conductor that constitutes the display unit or conductors that constitute the display-unit-driving wiring lines, and information concerning the corresponding electronic apparatus is written in the radio communication device as data.

Another electronic apparatus according to an aspect of the present invention is characterized in that at least a part of the antenna is formed on the substrate and is formed of a conductor formed by the same process as a conductor that constitutes the display unit or conductors that constitute the display-unit-driving wiring lines and information concerning the corresponding electronic apparatus is written in the radio communication device as data.

Since the information concerning the electronic apparatus that is a final product is written as data in the radio communication device in which the antenna is formed on the substrate of the display device, it is not necessary to perform a process of attaching the IC tag to the radio communication device during the processes of manufacturing the electronic apparatus. Therefore, it is possible to reduce the amount of effort and time. Further, since the display device is arranged so as to be easily found by a user in the electronic apparatus, the user can easily have the reader/writer approach the radio communication device to thus correctly write and read information. Since the radio communication device is originally included in the display device, it is possible to have the radio communication device store the information of the display device and to thus access the information of only the display device part of the electronic apparatus. The information concerning the corresponding electronic apparatus referred to here includes the product identification information, such as the lot number and the product number and the product record information, such as the manufacturing factory and the date of manufacture.

BRIEF DESCRIPTION OF THE DRAWINGS

FIG. 14 is a schematic explaining the function of a radio communication device;

FIG. 15 is a perspective view illustrating another example of the electronic apparatus according to an aspect of the present invention;

DETAILED DESCRIPTION OF EXEMPLARY EMBODIMENTS

First Exemplary Embodiment

A first exemplary embodiment of the present invention will be described with reference to FIGS. 1 to 7.

A display device according to the present exemplary embodiment is an example of a transmissive liquid crystal display device in an active matrix using an amorphous silicon thin film transistor (TFT) as a pixel switching element.

In the respective drawings, in order to make the respective components visualized, the reduced scales of the respective components vary.

Figure 1:
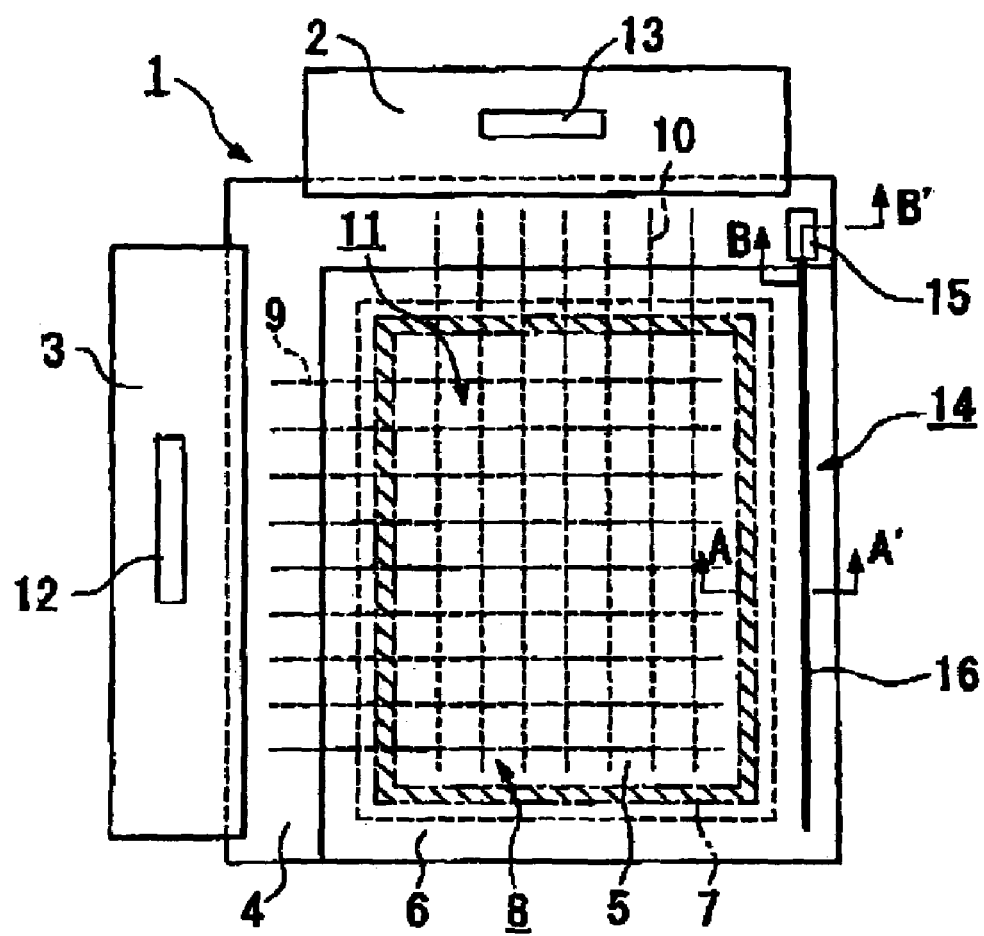
FIG. 1 is a schematic of a liquid crystal display device according to a first exemplary embodiment of the present invention.
Figure 2:
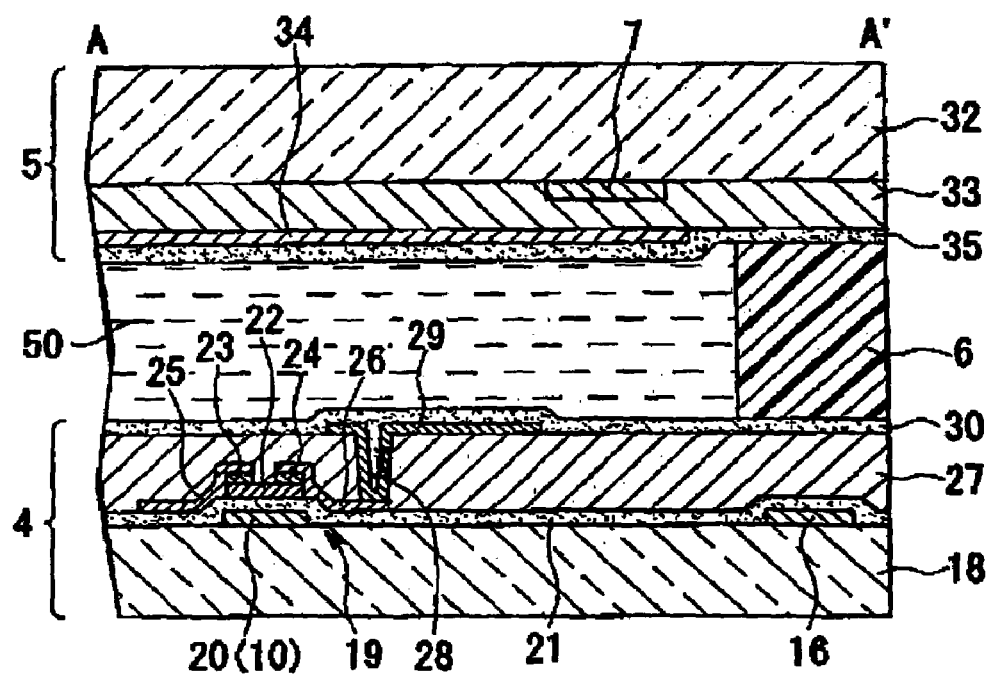
FIG. 2 is a sectional schematic taken along the plane. A-A' of FIG. 1.

The liquid crystal display device according to the present exemplary embodiment includes a liquid crystal cell 1 and two FPCs 2 and 3 (external substrates) connected to the liquid crystal cell 1, as illustrated in FIGS. 1 and 2. The liquid crystal cell 1 includes a rectangular element substrate 4 and a counter substrate 5. A liquid crystal layer 50 is interposed between the element substrate 4 and the counter substrate 5. The width and the length of the element substrate 4 are larger than the width and the length of the counter substrate 5. In FIG. 1, in the element substrate 4 and the counter substrate 5, the right sides overlap each other and the bottom sides overlap each other so that the left side and the top side of the element substrate 4 protrude from the counter substrate 5. A sealing material 6 is provided along the edge of the counter substrate 5 and a rectangular frame of light-shielding film 7 is provided inside the sealing material. A region bounded by the light-shielding film 7 is a display unit 8 that actually contributes to the display. A plurality of data lines 9 (display-unit-driving wiring lines) and a plurality of scanning lines 10 (display-unit-driving wiring lines) are arranged in a matrix in the display unit 8. A plurality of pixels 11 constituted of regions surrounded by the data lines 9 and the scanning lines 10 are arranged in a matrix. An amorphous silicon TFT and a pixel electrode (not shown in FIG. 1) are provided in each of the pixels 11.

The plurality of data lines 9 and the plurality of scanning lines 10 extend to the outside of the display unit 8. External connection terminals (not shown) are provided at the ends of the data lines 9 and the scanning lines 10 in non-display portion at the left end and the top end of the element substrate 4. The FPCs 2 and 3 that are elastically deformable films are attached to the left end and the top end of the element substrate 4, respectively. Wiring line patterns (not shown) on the FPCs 2 and 3 and external connection terminals on the element substrate 4 are electrically connected to each other. A data line driving data driver IC 12 and a scanning line driving gate driver IC 13 are mounted on the FPCs 2 and 3, respectively. The respective pixels 11 in the display unit 8 are driven by signals from the driver ICs 12 and 13. A radio communication device 14 is provided along the right side of the liquid crystal cell 1 in FIG. 1. The radio communication device 14 includes a memory, an IC chip 15 (a communication integrated circuit) in which a CPU is mounted, and an antenna 16 to transmit and receiving radio waves. According to the present exemplary embodiment, the IC chip 15 is mounted on the top right corner of the element substrate 4. The antenna 16 is formed along the right side of the element substrate 4 to which the FPCs 2 and 3 are not attached.

In the sectional structure of the liquid crystal display device, as illustrated in FIG. 2, a pixel switching TFT 19 is formed on the internal surface (the surface facing a liquid crystal layer 50) of a glass substrate 18 that constitutes the element substrate 4. A pixel switching TFT 19 includes a gate electrode 20 (a scanning line 10), a gate insulating film 21, a semiconductor layer 22, a source layer 23, a drain layer 24, a source electrode 25 (a data line 9), and a drain electrode 26 and is covered with an interlayer insulating film 27. A contact hole 28 is formed in the interlayer insulating film 27.

A pixel electrode 29 made of a transparent conductive film, such as ITO (Indium Tin Oxide) is connected to the drain electrode 26 through the contact hole 28. An alignment film 30 is formed on the outermost surface of the element substrate 4. A light-shielding film 7 made of a metal having a low light reflection ratio, such as chrome, is formed on the internal surface (the surface facing the liquid crystal layer 50) of a glass substrate 32 that constitutes the counter substrate 5. An insulating film 33 that covers the light-shielding film 7 is further formed. A common electrode 34 is formed on the insulating film 33. An alignment film 35 is formed on the outermost surface of the counter substrate 5. The antenna 16 is formed in a region below the sealing material 6 on the glass substrate 18 that constitutes the element substrate 4.

The antenna 16 is formed outside the light-shielding film 7, that is, outside the display unit 8. The antenna 16 is formed on the same layer as the gate electrode 20 (the scanning line 10) of the pixel switching TFT 19. That is, the antenna 16 and the gate electrode 20 (the scanning line 10) are made of the same material, such as aluminum, used as a typical wiring line material by the same manufacturing process. In the entire structure of the liquid crystal cell 1, conductive films, such as the common electrode 34 and the light-shielding film 7, are formed above the antenna 16 (on a layer facing the counter substrate 5). However, the conductive films are arranged so as not to overlap the antenna 16 in plan view.

Figure 3:
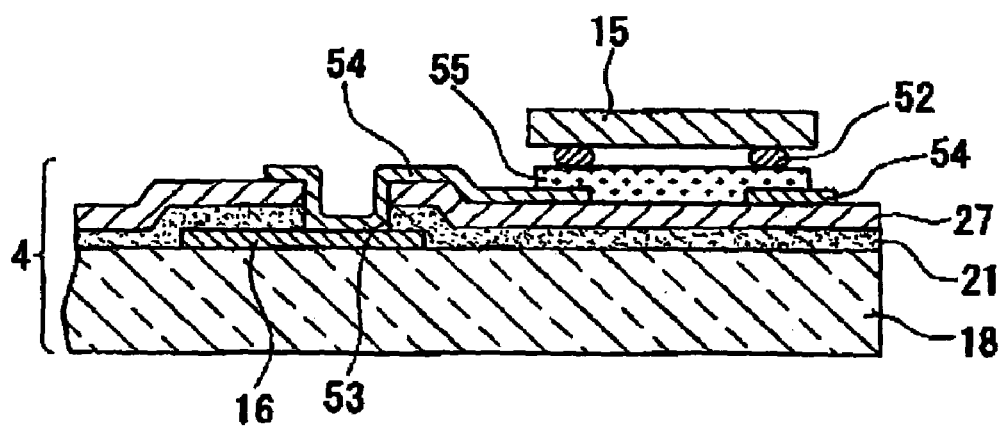
FIG. 3 is a sectional schematic taken along the plane B-B' of FIG. 1.

The sectional structure of a connection between the IC chip 15 and the antenna 16 is illustrated in FIG. 3.

That is, the IC chip 15 has a plurality of bumps 52 for connection and is mounted on the element substrate 4 through the bumps 52, which is referred to as COG (Chip On Glass) mounting. A contact hole 53 that reaches the top face of the antenna 16 is formed in the interlayer insulating film 27 and the gate insulating film 21. A relay conductor 54 is formed so as to cover the internal surface of the contact hole 53 and to extend onto the interlayer insulating film 27. As a result, the relay conductor 54 and the antenna 16 are electrically connected to each other in the contact hole 53. The bumps 52 of the IC chip 15 are electrically connected to the end of the relay conductor 54 through an anisotropic conductive film 55. The relay conductor 54 is formed on the same layer as the pixel electrode 29. That is, the relay conductor 54 and the pixel electrode 29 are made of the same material, such as ITO, by the same manufacturing process. As mentioned above, according to the present exemplary embodiment, the antenna 16 is formed on the same layer (of the same material) as the gate electrode 20 by the same process. Also, the relay conductor 54 is formed on the same layer (of the same material) as the pixel electrode 29 by the same process. Though not shown, when a power source voltage or a signal is input to the IC chip 15, which may be input through wiring lines on the FPCs 2 and 3 and wiring lines constituted of the same layers as the scanning lines 10 and the data lines 9 on the element substrate 4.

In the liquid crystal display device according to the present exemplary embodiment, the entire antenna 16 that constitutes the radio communication device 14 is formed on the same layer and of the same material as the gate electrode 20 (the scanning line 10) outside the display unit 8 of the liquid crystal cell 1 by the same process. According to this structure, it is not necessary to provide a space to attach the antenna 16, unlike in the case where the IC tag on the market is attached to the liquid crystal display device. Therefore, it is possible to reduce the amount of time and effort required to attach the antenna 16. When as the radio communication device 14, the IC chip 15 as represented by the reference numeral T of FIG. 14 includes a memory 57 (a writing unit) to store information, information concerning the corresponding display device, such as the product identification information and the product record information, is stored so as to use a wireless IC tag for the managements of products and processes during production and distribution processes. In the related art, processes are managed with respect to several hundreds or thousands of liquid crystal display devices in units of lots. However, according to an aspect of the present invention, processes can be managed with respect to each liquid crystal display device. Therefore, the flexibility of processes increases. When the IC chip 15 as represented by the reference numeral R of FIG. 14 includes a controller 58 of a transmitting and receiving unit, the controller 58 can be used as a reader/writer to write information in and read information from, another radio communication device.

Further, when a rewritable region and a non-rewritable region are formed in the memory 57, unchangeable information that is meant to be permanently preserved, such as the product identification information, is stored in the non-rewritable region and information required to be changed into the latest information is stored in the rewritable region. Further, the information read from the radio communication device 14 can be stored in the memory 57 or can be rewritten.

According to the present exemplary embodiment, since the IC chip 15 is mounted on the element substrate 4 of the liquid crystal cell 1, it is possible to easily mount the radio communication device 14 on the element substrate 4 by mounting a previously prepared IC chip 15. In particular, when the IC chip 15 is mounted right after the liquid crystal cell 1 is completed, it is possible to begin to manage products and processes using the radio communication device 14 from a point before connecting a driving FPC to the radio communication device 14. According to the present exemplary embodiment, since the antenna 16 and the relay conductor 54 to connect the IC chip 15 to the antenna 16, are formed on the same layer (of the same material) as the pixel electrode 29 by the same process, it is possible to limit the number of processes and to reduce the possibility or prevent the manufacturing processes from being complicated. Further, since a conductor, such as the common electrode 34 and the light-shielding film 7, which constitutes the liquid crystal display device, is arranged so as not to overlap the antenna 16 in plan view, it is possible to reduce or prevent radio waves from being shielded by the conductor and to correctly write and read information.

When the product information concerning the corresponding display device, such as the product identification information and the product record information, is stored in the memory of the IC chip 15, it is possible to use the wireless IC tag for the management of products and processes during production and distribution processes. In the related art, processes are managed with respect to several hundreds and thousands of liquid crystal display devices in units of lots. However, according to an aspect of the present invention, processes can be managed with respect to each liquid crystal display device. Therefore, the flexibility of processes increases.

According to the present exemplary embodiment, the antenna 16 is formed on the same layer as the gate electrode 20. However, it may be formed on the same layer as the data line 9 or the pixel electrode 29. The antenna may be formed on a plurality of layers by assembling the gate electrode 20, the data lines 9, and the pixel electrode 29. Also, the layer that constitutes the relay conductor 54 to connect the IC chip to the antenna is not limited to the same layer as the pixel electrode 29. A structure of mounting the IC chip 15 on the substrate is not limited to the COG method. The IC chip may be directly connected to the antenna without passing through the relay conductor 54. The driving driver ICs 12 and 13 may be directly mounted on the element substrate 4 by the COG method as well as being mounted on the FPCs 2 and 3. It is possible to appropriately change the connection arrangement based on the type of the pixel switching TFT 19 and the type (transmissive/reflective/transflective) of the liquid crystal display device.

Figure 4:
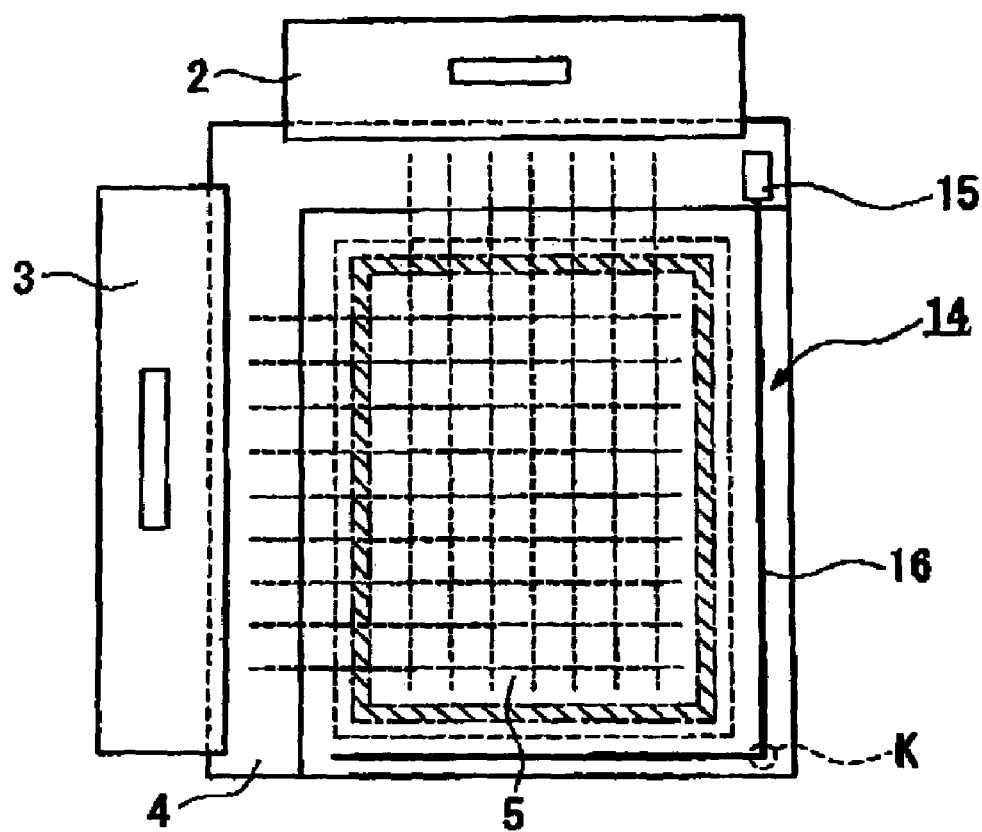
FIG. 4 is a schematic illustrating a modification of the arrangement of an antenna.
Figure 5:
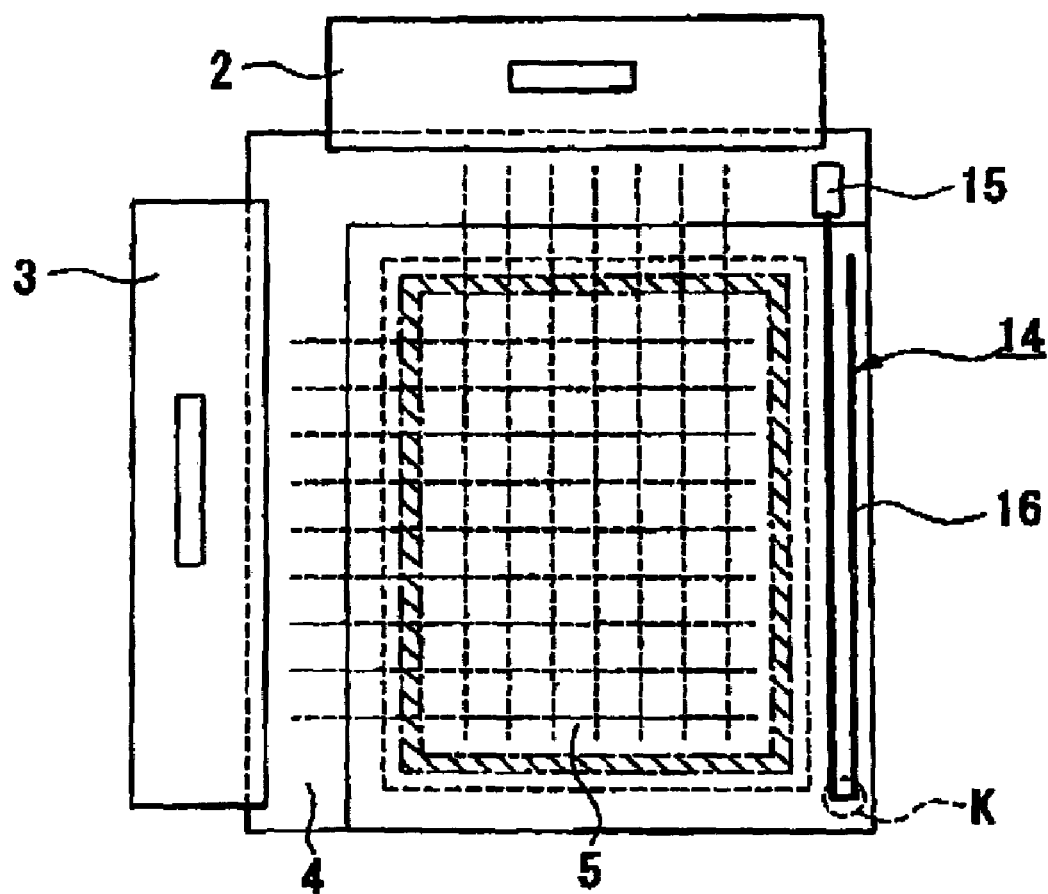
FIG. 5 is a schematic illustrating another modification of the arrangement of the antenna.
Figure 6:
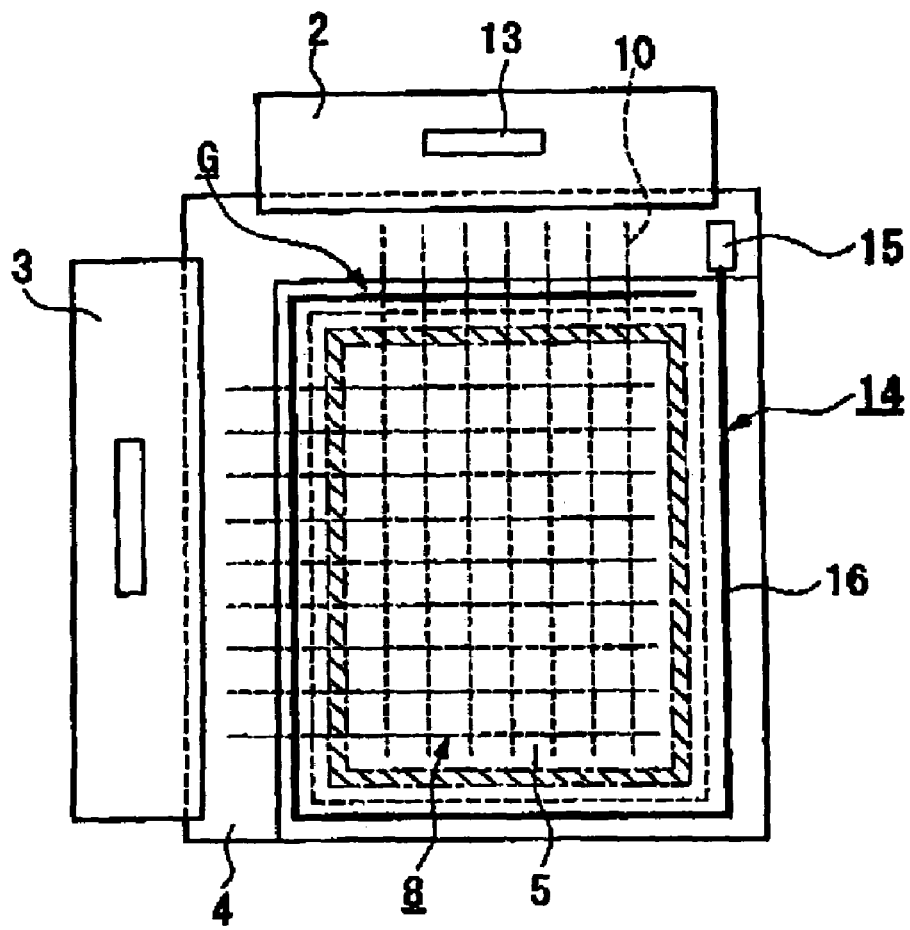
FIG. 6 is a schematic illustrating still another modification of the arrangement of the antenna.
Figure 7:
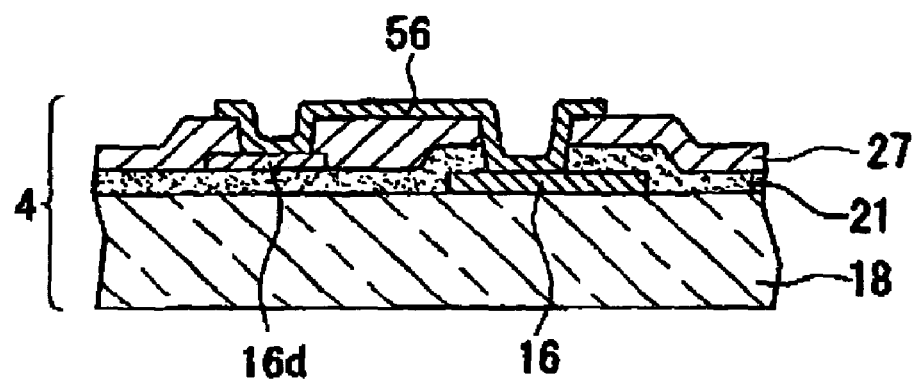
FIG. 7 is a sectional schematic of part of the structure of FIG. 6.

As illustrated in FIG. 4, as well as FIG. 1, the antenna 16 may turn at the corner K of the element substrate 4 at an angle of 90° and thus may be arranged along two sides. As illustrated in FIG. 5, the antenna 16 may be multi-arranged so as to extend along one side and to turn at the corner K of the element substrate 4 at an angle of 180° to thus be returned. As illustrated in FIG. 6, the antenna 16 may be arranged along three or more sides. In the case of FIG. 6, according to the present exemplary embodiment, when the antenna 16 is formed on the same layer as the scanning line 10, the antenna 16 is short circuited against the scanning lines 10 that extend toward the gate driver IC 13 on the FPC 2 outside the display unit 8, which may cause some problems. Therefore, in the portions (the portions G in FIG. 6) through which the scanning lines 10 pass, as illustrated in FIG. 7, it is necessary to form an antenna 16d on the same layer as the data line 9 through a relay conductor 56 formed on the same layer as the pixel electrode 29 and not to short circuit the antenna 16d against the scanning lines 10 that are provided under the antenna 16d. When it is necessary to increase the length of the antenna 16, the antenna 16 may wind around the display unit 8 several times.

Second Exemplary Embodiment

A second exemplary embodiment of the present invention will now be described with reference to FIGS. 8 and 9.

The basic structure of the liquid crystal display device according to the present exemplary embodiment is the same as the structure of the first exemplary embodiment excluding the position in which the IC chip is mounted and the structure of the antenna in accordance with the position of the IC chip.

Figure 8:
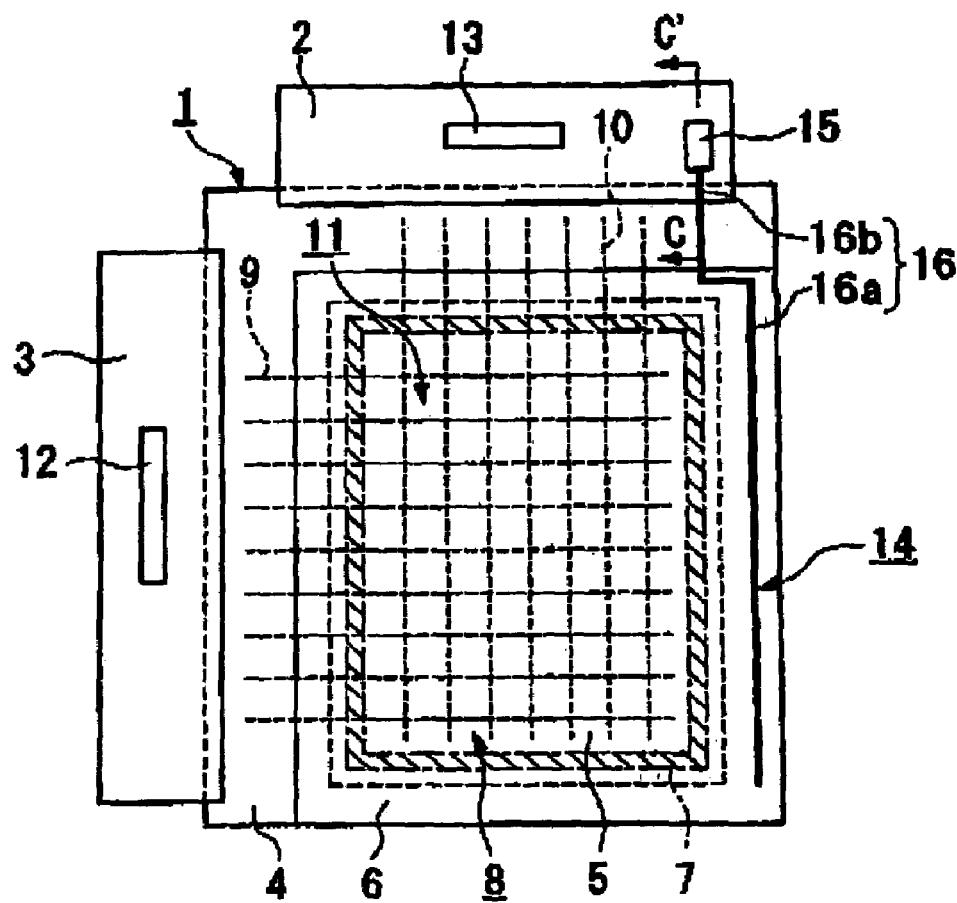
FIG. 8 is a schematic of a liquid crystal display device according to a second exemplary embodiment of the present invention.
Figure 9:
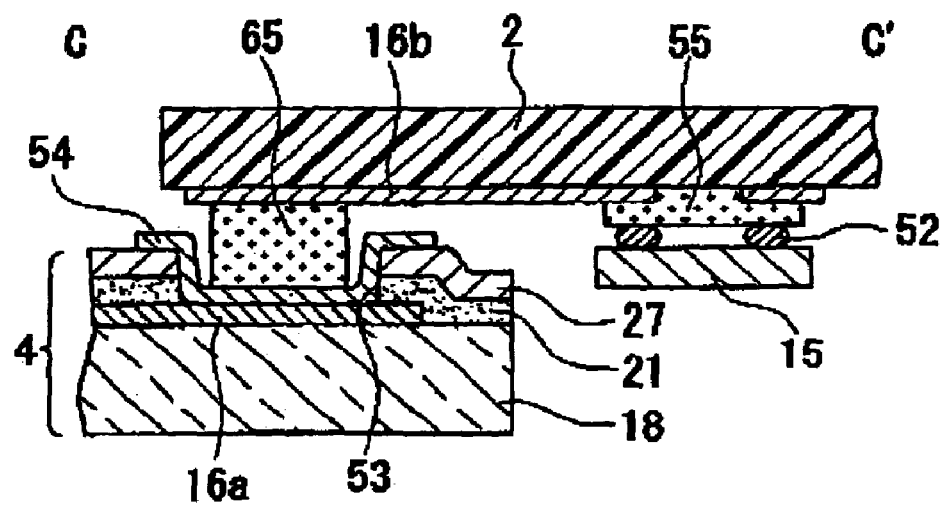
FIG. 9 is a sectional schematic taken along the plane C-C' of FIG. 8.

In FIGS. 8 and 9, the same components as those of FIGS. 1 to 3 are denoted by the same reference numerals and the detailed description thereof will be omitted.

According to the first exemplary embodiment, the IC chip 15 is mounted on the element substrate 4 of the liquid crystal cell 1. The entire antenna 16 is formed on the element substrate 4. On the other hand, according to the present exemplary embodiment, as illustrated in FIG. 8, the IC chip 15 is mounted on the FPC 2 (an external substrate). The antenna 16 is constituted of the first antenna 16a formed on the element substrate 4 and the second antenna 16b provided on the FPC 2.

According to the sectional structure illustrated in FIG. 9, the first antenna 16a on the element substrate 4 is formed on the same layer as the scanning line 10 like in the first exemplary embodiment. The contact hole 53 that reaches the top face of the first antenna 16a is formed in the interlayer insulating film 27 and the gate insulating film 21. The relay conductor 54 formed on the same layer as the pixel electrode 29 covers the internal surface of the contact hole 53 and extends onto the interlayer insulating film 27. Therefore, the relay conductor 54 and the first antenna 16a are electrically connected in the contact hole 53. The second antenna 16b made of a copper wiring line like another typical FPC wiring line is provided on the FPC 2. The relay conductor 54 on the first antenna 16a and the second antenna 16b are electrically connected to each other through an anisotropic conductive film 65. The bumps 52 of the IC chip 15 are electrically connected to the end of the second antenna 16b through an anisotropic conductive film 55. The copper wiring line on the FPC 2 may be appropriately connected to the IC chip 15 and a power source voltage or a signal may be input through the wiring line.

In the liquid crystal display device according to the present exemplary embodiment, it is not necessary to provide a special space to attach the antenna, unlike the case where the IC tag on the market is attached to the liquid crystal display device. Therefore, it is possible to reduce the amount of time and effort required to attach the antenna to the liquid crystal display device. Since the antenna 16a and the relay conductor 54 are formed on the same layer (of the same material) as the other conductors by the same process, it is possible to limit the number of processes and to thus reduce the possibility or prevent the manufacturing processes from being complicated.

According to the present exemplary embodiment, even if the liquid crystal cell 1 is small and the first antenna 16a formed on the element substrate 4 is not long enough, it is possible to compensate for the inadequate length of the entire antenna 16 with the second antenna 16b on the FPC 2 and to thus obtain an entire antenna having a desired performance. Therefore, it is possible to enhance the degree of freedom in designing the antenna. Since many wiring lines are originally provided on the FPC 2, it is not burdensome to provide the additional wiring line that serves as the second antenna 16b on the FPC 2.

The FPC may be connected to the element substrate of the liquid crystal cell and to a printed wiring line board on which various electronic parts are mounted. According to this structure, the IC chip may be mounted on the printed wiring line board and not on the FPC. In this case, in addition to the first antenna on the element substrate and the second antenna on the FPC, a wiring line (a conductor) on the print wiring line board may be used as a third antenna to thus constitute the entire antenna.

Third Exemplary Embodiment

Figure 10:
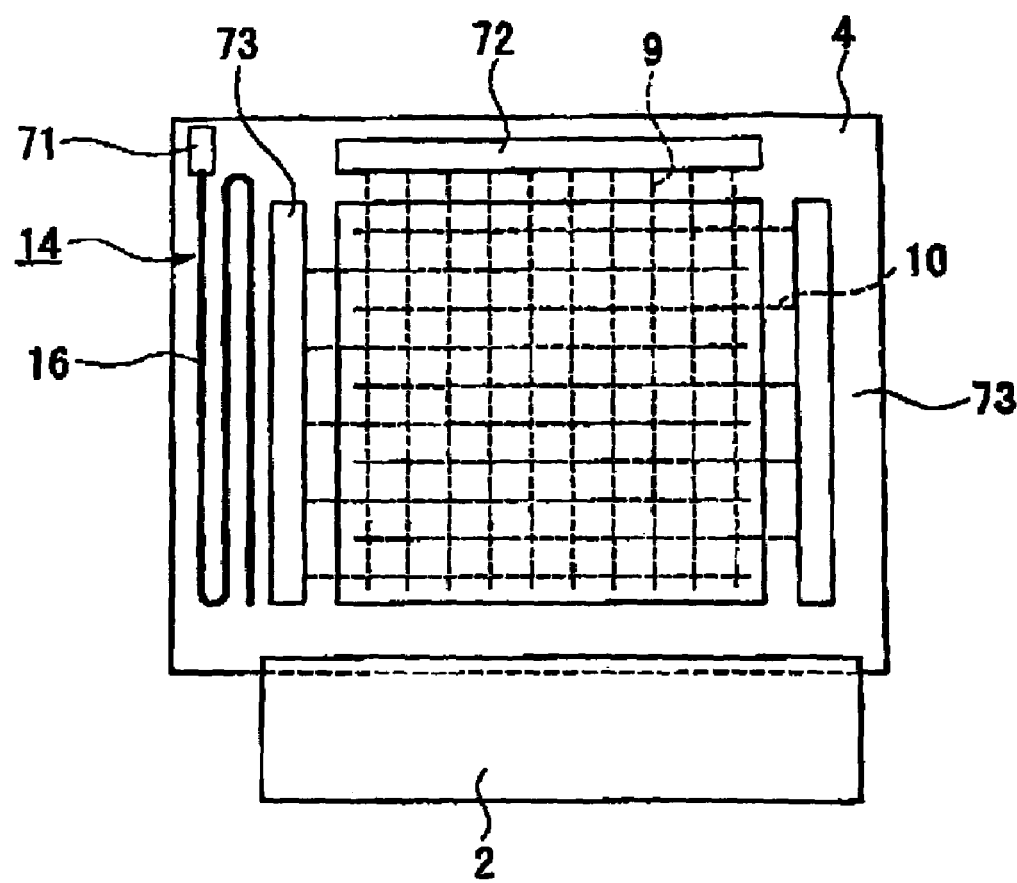
FIG. 10 is a schematic of a liquid crystal display device according to a third exemplary embodiment of the present embodiment.

A third exemplary embodiment of the present invention will be described with reference to FIG. 10.

A display device according to the first and second exemplary embodiments is a liquid crystal display device using an amorphous silicon TFT as a pixel switching element. On the other hand, a display device according to the present exemplary embodiment is a liquid crystal display device using polycrystalline silicon TFT or a single crystal silicon TFT as a pixel switching element.

The amorphous silicon TFT cannot constitute a communication integrated circuit in an IC chip that constitutes a radio communication device in consideration of driving ability as a transistor. The polycrystalline silicon TFTs or the single crystal silicon TFTs have enough driving ability to thus constitute the communication integrated circuit. Therefore, according to the present exemplary embodiment, as illustrated in FIG. 10, a communication integrated circuit 71 (a communication integrated-circuit unit) is directly formed on the element substrate 4 using a plurality of polycrystalline silicon TFTs or a plurality of single crystal silicon TFTs. When the polycrystalline silicon TFTs or the single crystal silicon TFTs are used, it is possible to form a data line driving circuit 72 and a scanning line driving circuit 73 that include N channel TFTs or P channel TFTs if necessary on the element substrate 4. Therefore, it is possible to simultaneously form the TFTs that constitute the communication integrated circuit 71 and the TFTs that constitute the data line driving circuit 72 and the scanning line driving circuits 73 by the same process. Any conductor that constitutes the element substrate 4 may be used as the antenna 16. For example, the antenna 16 may be simultaneously formed of aluminum of which the data lines 9 are made by the same process as the data lines 9. A conductor that constitutes scanning lines 10, capacitor electrodes, a light-shielding layer, a shield layer, and pixel electrodes may be used as for the antenna 16.

In the liquid crystal display device according to the present exemplary embodiment, it is not necessary to provide a special space to attach the antenna like in the case where the IC tag on the market is attached to the liquid crystal display device. Also, it is possible to reduce the amount of time and effort required to attach the antenna to the liquid crystal display device. Since the antenna 16 is formed on the same layer (of the same material) as the other conductors by the same process, it is possible to limit the number of processes and to minimize or prevent the manufacturing processes from being complicated. So thus, it is possible to obtain the same effect as the above exemplary embodiments. According to the present exemplary embodiment, since a radio communication device 14 is formed on the substrate in a state of the element substrate 4 prior to a step where the element substrate 4 is completed as a liquid crystal cell is completed, it is possible to previously write information at the substrate state of fabrication. As a result, the traceability of products is excellent.

Fourth Exemplary Embodiment

Figure 11:
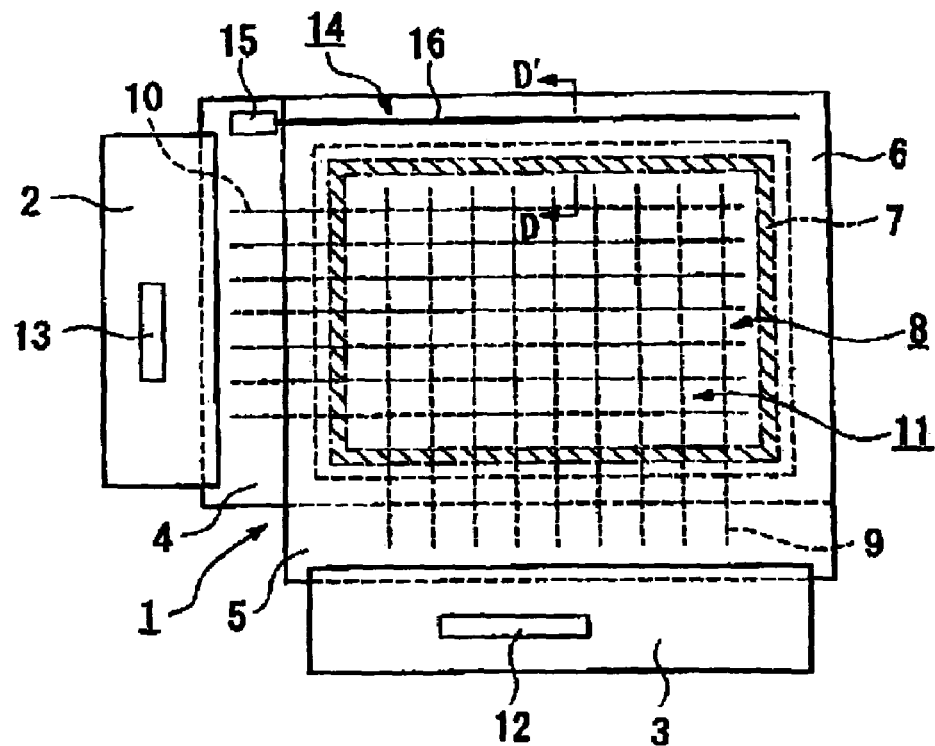
FIG. 11 is a schematic of a liquid crystal display device according to a fourth exemplary embodiment of the present invention.

A fourth exemplary embodiment of the present invention will be described with reference to FIGS. 11 and 12.

A display device according to the first to third exemplary embodiments is a liquid crystal display device using a TFT as a pixel switching element. On the other hand, a display device according to the present exemplary embodiment is a liquid crystal display device using a TFD (thin film diode) as a pixel switching element.

The schematic structure of the liquid crystal display device according to the present exemplary embodiment is almost the same as that of the first exemplary embodiment. As illustrated in FIG. 11, the liquid crystal display device according to the present exemplary embodiment includes the liquid crystal cell 1 and the two FPCs 2 and 3. The liquid crystal cell 1 includes the element substrate 4 and the counter substrate 5 that face each other. The FPCs 2 and 3 are attached to the element substrate 4 and the counter substrate 5, respectively. The data driver IC 12 and the gate driver IC 13 are mounted on the FPCs 2 and 3, respectively. The radio communication device 14 is provided along the top side of the liquid crystal cell 1 in FIG. 11. According to the present exemplary embodiment, the IC chip 15 is mounted on the top left corner of the element substrate 4. The antenna 16 is formed along the top side of the element substrate 4.

Figure 12:
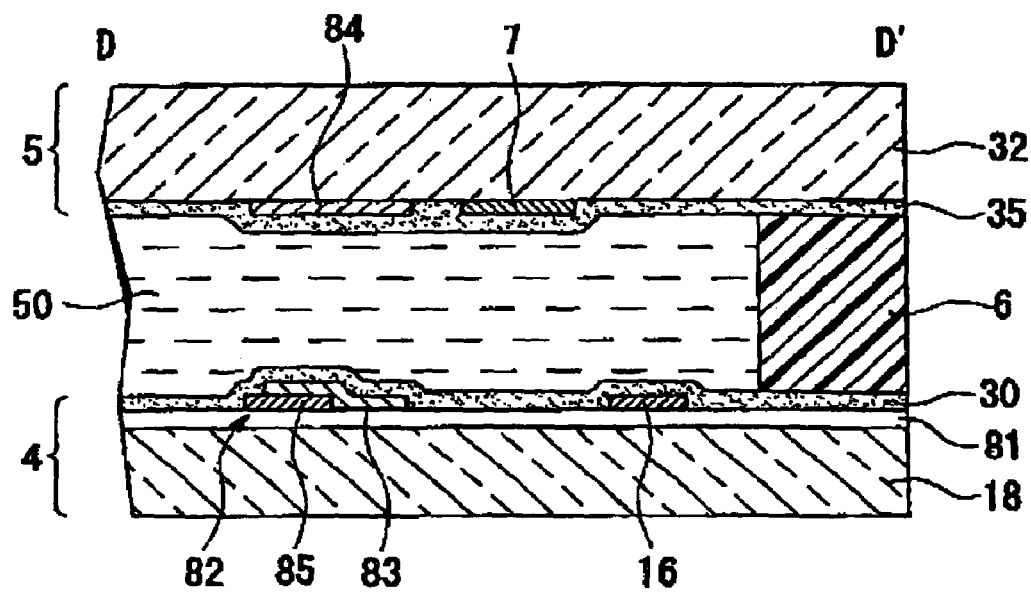
FIG. 12 is a sectional schematic taken along the plane D-D' of FIG. 11.

According to the sectional structure of the liquid crystal display device, as illustrated in FIG. 12, a base insulating film 81, made of TaOx (Tantalum Oxide), is formed on the internal surface (the surface facing a liquid crystal layer 50) of a glass substrate 18 that constitutes the element substrate 4. A pixel switching TFD 82 is formed on the base insulating film 81. A pixel electrode 83, made of a transparent conductive film, is connected to the pixel switching TFD 82. An alignment film 30 is formed on the outermost surface thereof. A counter electrode 84 and a light-shielding film 7 are formed on the internal surface (the surface facing the liquid crystal layer 50) of a glass substrate 32 that constitutes the counter substrate 5. An alignment film 35 is formed on the outermost surface. The antenna 16 is formed on the base insulating film 81 of the element substrate 4. The antenna 16 is formed outside the light-shielding film 7 of the counter substrate 5, that is, outside the display unit 8. The antenna 16 is formed on the same layer as a Ta electrode 85 of the pixel switching TFD 82. That is, the antenna 16 and the Ta electrode 85 are made of the same material by the same manufacturing process. The conductive films, such as the counter electrode 84 and the light-shielding film 7 above the antenna 16 (on a layer facing the counter substrate 5), are arranged so as not to overlap the antenna 16 in plan view.

In the liquid crystal display device according to the present exemplary embodiment, it is not necessary to provide a special space to attach the antenna, unlike in the case where the IC tag on the market is attached to the liquid crystal display device. Also, it is possible to reduce the amount of time and effort required to attach the antenna. Since the antenna is formed on the same layer (of the same material) as the other conductors by the same process, it is possible to limit the number of processes and to minimize or prevent the manufacturing processes from being complicated.

Electronic Apparatus

An exemplary embodiment of the electronic apparatus according to an aspect of the present invention will now be described with reference to FIG. 13.

Figure 13:
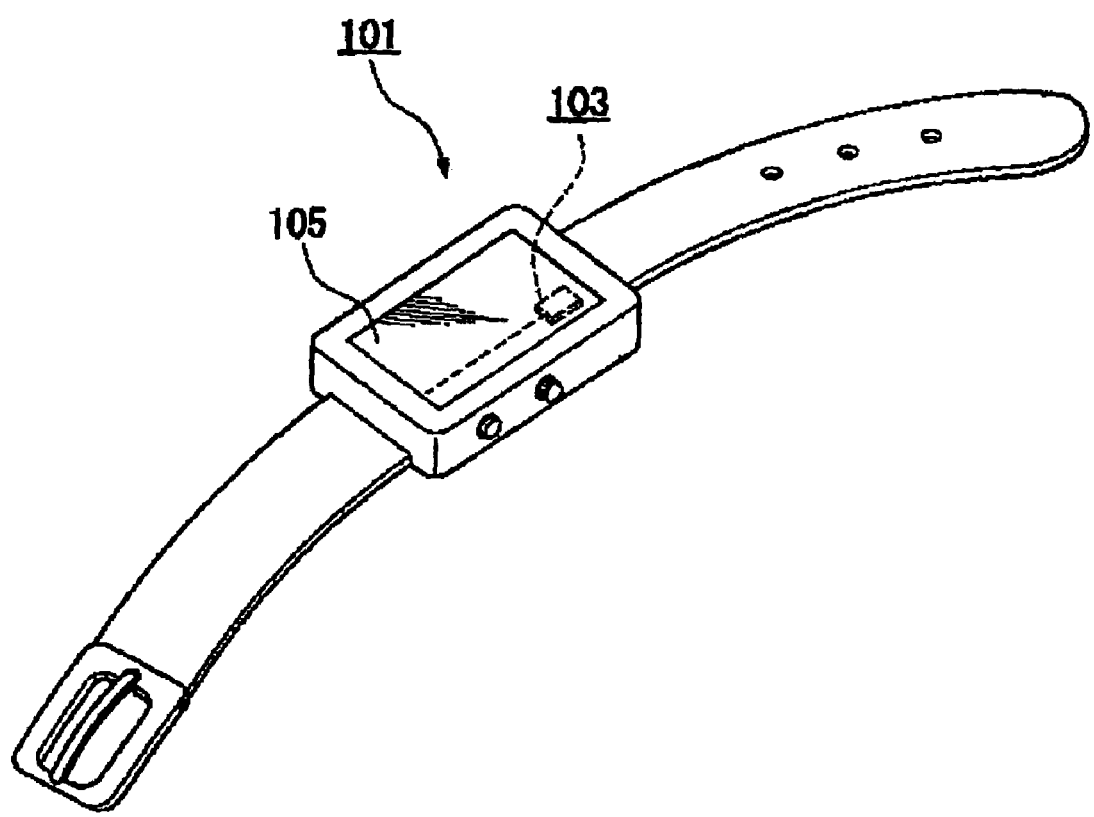
FIG. 13 is a perspective view illustrating an example of an electronic apparatus according to an aspect of the present invention.

FIG. 13 illustrates a wrist type reader/writer (an electronic apparatus) 101 as an example of the electronic apparatus using the liquid crystal display device according to the above exemplary embodiments. The wrist type reader/writer 101 can be attached to the wrist or a palm of a user like a watch. For example, if a wireless IC tags are attached to products in a department store or a market when a user brings his or her hand close to a product in order to read the information written in the wireless IC tag attached to the product, a radio communication device 103 in the reader/writer 101 reads the information from the wireless IC tag. The information read from the wireless IC tag is displayed in a liquid crystal display 105. In addition, it is possible to rewrite the information in the wireless IC tag attached to the product.

Since the reader/writer 101 according to the present exemplary embodiment can be worn round a user's wrist, the user can freely move his or her hands and fingers. Therefore, the user can freely lift products to thus conveniently use the reader/writer 101. Also, it is possible to minimize or prevent his or her privacy from being invaded by using the writing function. For example, when the wireless IC tag is thrown away, others may obtain information concerning the products that the user bought and the taste of the user from the thrown away wireless IC tag. In this case, the user preferably deletes or changes the information using the function of the writer before the user throws away the wireless IC tag. Further, the function as a watch may be added to the reader/writer 101 according to the present exemplary embodiment so that time is displayed on a liquid crystal display 103. In this case, when the function of the reader/writer is not used, the reader/writer 101 can be used as a wristwatch. According to other exemplary embodiments, the present invention can be applied to personal computers, PDAs, portable TVs, mobile telephones, digital cameras, vehicles, measuring apparatuses, and television sets.

Another exemplary embodiment of the electronic apparatus including the liquid crystal display device according to the present exemplary embodiment will now be described with reference to FIG. 15.

FIG. 15 is a perspective view illustrating an example of a portable information processing device, such as a personal computer. In FIG. 15, the reference numeral 1200 denotes an information processing device (an electronic apparatus), the reference numeral 1202 denotes an input unit, such as a keyboard, the reference numeral 1204 denotes a main body of the information processing device and the reference numeral 1206 denotes a liquid crystal display unit using the liquid crystal display device.

The liquid crystal display device according to the above exemplary embodiments is encased in the case of the information processing device 1200. Only the liquid crystal display unit 1206 is exposed through the window of the case. As illustrated in the above exemplary embodiments, the radio communication device 14 on the liquid crystal display device is arranged outside the liquid crystal display unit 1206 to thus be hidden in the case, the user cannot see the radio communication device 14. Therefore, a mark 99 showing the location of the radio communication device 14 is provided on the case around the place where the radio communication device 14 is provided. A conductor does not exist in direct front of the radio communication device 14 inside the case. Product information concerning the information processing device that is the final product is written in the radio communication device 14 in addition to the product information concerning the liquid crystal display device according to the above exemplary embodiments as data. The product information includes manufacturing record information, such as the manufacturing factory and the date of manufacture of the information processing device and information on distribution, sales, and recycling.

In an electronic apparatus according to the present exemplary embodiment, since the product information concerning the information processing device that is the final product is stored in the radio communication device 14 on the liquid crystal display device, it is not necessary to use the IC tag for each information processing device. Therefore, a process of attaching the IC tag to the information processing device is not necessary in the manufacturing processes of the information processing device. As a result, it is possible to reduce the amount of effort and time and to thus reduce manufacturing costs. Also, since the liquid crystal display unit 1206 is arranged in the front as seen by the user and the mark 99 is provided in the place where the radio communication device 14 is arranged, the user can easily make the reader/writer approach the radio communication device 14. Since a conductor does not exist directly in front of the radio communication device 14, it is possible to prevent radio waves from being shielded by the conductor. As a result, it is possible to correctly write and read information using the information processing device according to the present exemplary embodiment and to use the information processing device for various purposes, such as the management of manufacturing processes, the management of distribution, the management of sales and inventory, and the management of life cycles.

Still another exemplary embodiment of the electronic apparatus including the liquid crystal display device according to the above exemplary embodiments will now be described with reference to FIGS. 16 and 17.

Figure 16A:
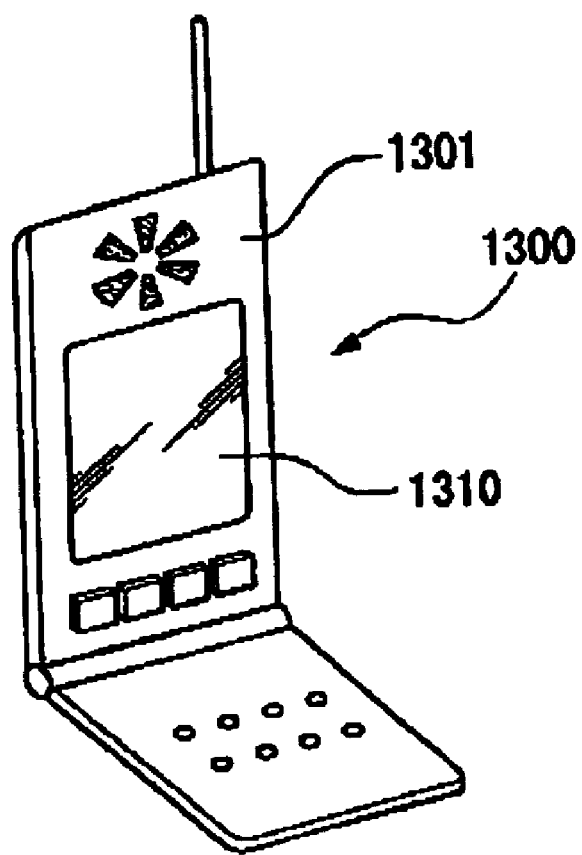
FIGS. 16A and 16B are a perspective view illustrating more examples of an electronic apparatus according to an aspect of the present invention.
Figure 16B:
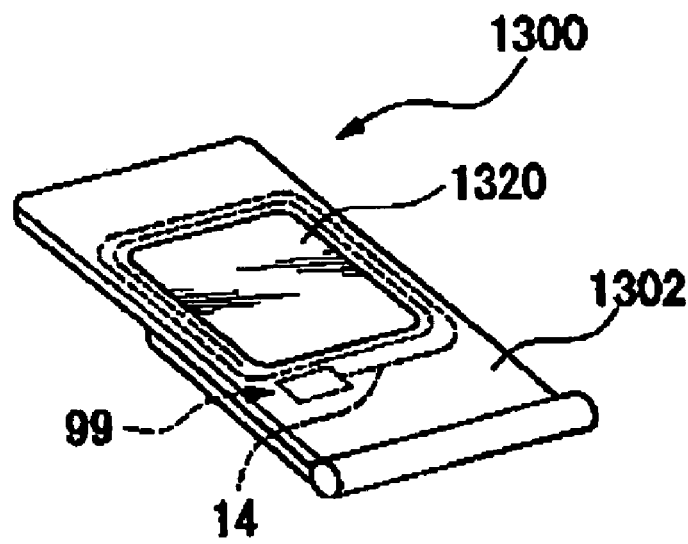

FIG. 16A is a perspective view of an example of a foldable mobile telephone, which illustrates a state where the folding mobile telephone is unfolded. FIG. 16B is a perspective view illustrating a state where the folding mobile telephone is folded.

In FIGS. 16A and 16B, reference numeral 1300 denotes a mobile telephone (an electronic apparatus), the reference numeral 1310 denotes a liquid crystal display device that is a main display unit (one display device), and the reference numeral 1320 denotes the liquid crystal display device according to an aspect of the present invention that is a secondary display unit (the other display device), respectively.

For example, the main display unit 1310 is provided in the surface that is the internal surface 1301 when the folding mobile telephone is folded, as illustrated in FIG. 16A. The secondary display unit 1320 is provided in the surface (the opposite surface) that is the external surface 1302 when the folding mobile telephone is folded, as illustrated in FIG. 16B.

The main display unit 1310 and the secondary display unit 1320 are encased in the case of the mobile telephone 1300. Only the display surfaces of the main display unit 1310 and the secondary display unit 1320 are exposed through the window of the case. As described in the above exemplary embodiments, since the radio communication device 14 on the liquid crystal display device is arranged outside the secondary display unit 1320 to thus be hidden in the case, the user cannot directly see the radio communication device 14. Therefore, the mark 99 showing the location of the radio communication device 14 is provided on the case around the place where the radio communication device 14 is provided.

The antenna of the radio communication device 14 winds around the outer circumference of the secondary display unit 1320 several times.

The radio communication device 14 is formed so that the information concerning the mobile telephone 1300 can be converted into data.

Figure 17:
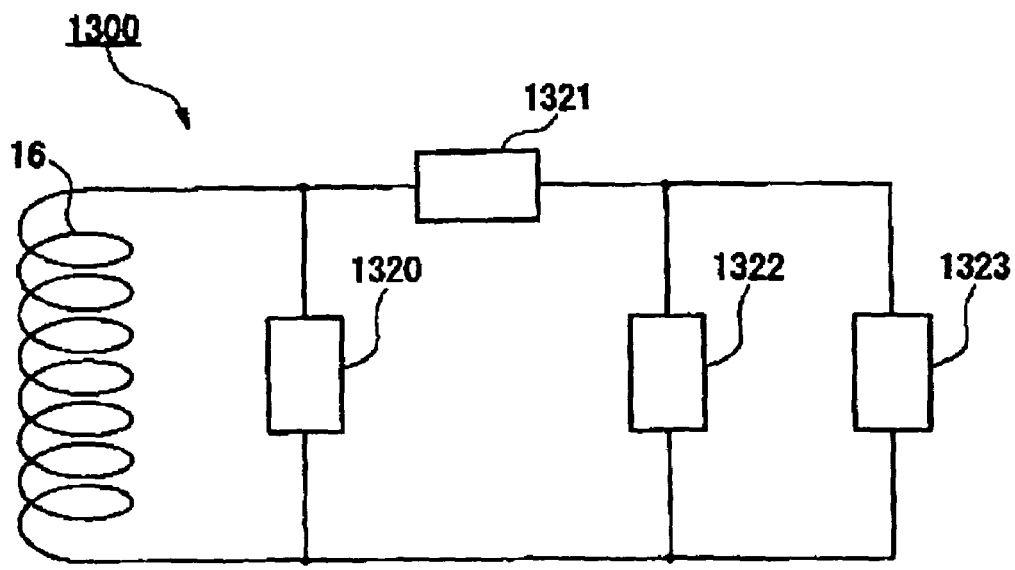
FIG. 17 is a schematic illustrating an electric circuit equivalent to the electric circuit of the electronic apparatus of FIGS. 16A and 16B.

FIG. 17 is a schematic view illustrating the electric circuit of the folding mobile telephone using the liquid crystal display device according to the above exemplary embodiments.

As illustrated in FIG. 17, the electric circuit of the mobile telephone 1300 includes the antenna 16 of the radio communication device 14, the secondary display unit 1320, a diode (a rectifier) 1321, a capacitor (a charging unit and a power source unit) 1322, and another device 1323 including the main display unit 1310.

The diode 1321 to control the flow of current to one direction is arranged between the antenna 16 and the capacitor 1322. The capacitor 1322 and the antenna 16 are electrically connected to each other so that the power stored in the capacitor 1322 can be supplied to the antenna 16. The capacitor 1322 and the apparatus 1323 are electrically connected to each other so that the power stored in the capacitor 1322 can be supplied to the apparatus 1323.

As described above, a battery capable of being repeatedly charged, such as a lithium battery, as well as the capacitor 1322, may be used as the charging unit.

Figure 18:
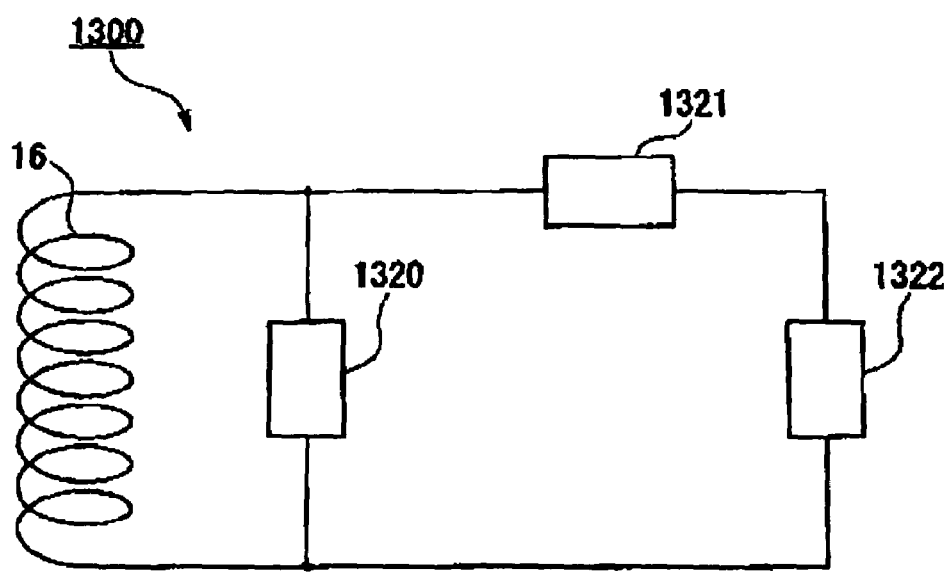
FIG. 18 is a schematic illustrating another example of the electric circuit equivalent to the electric circuit of the electronic apparatus of FIGS. 16A and 16B.

According to the electric circuit of the mobile telephone 1300, as illustrated in FIG. 17, the antenna 16 or the capacitor 1322 and the apparatus 1323 may be formed in the same circuit. As illustrated in FIG. 18, the antenna 16 or the capacitor 1322 and the apparatus 1323 may be formed in different circuits.

In the mobile telephone 1300 according to the present exemplary embodiment, the radio communication device 14 can correctly write information in and read information from another radio communication device by making the secondary display unit 1320 approach the apparatus that includes the radio communication device in a state where the mobile telephone 1300 is unfolded to thus visualize images displayed on the main display unit 1310.

That is, the secondary display unit 1320 faces the outside in the above state. As a result, there is no fear that the case of the mobile telephone 1300 prevents the radio communication device 14 from writing information in the radio communication device and reading information from the radio communication device.

It is possible to display the information, written in and read from, the radio communication device by the radio communication device 14 on the main display unit 1310. Therefore, it is possible to check the information, written in and read from, the radio communication device without changing the direction of the mobile telephone 1300 and to instantaneously check the information, written in and read from, the radio communication device.

Since the antenna 16 and the capacitor 1322 of the radio communication device 14 are electrically connected to each other, when radio waves are emitted to the antenna 16, it is possible to store the current caused within the antenna 16 by electromagnetic induction in the capacitor 1322. Therefore, it is possible to supply power to the mobile telephone 1300 and to charge the mobile telephone 1300 without connecting the mobile telephone 1300 to an external power source. For example, it is possible to supply power to the mobile telephone 1300 and to charge the mobile telephone 1300 without using a dedicated charger for the mobile telephone 1300. As a result, it is possible to solve the problem that the mobile telephone 1300 cannot be charged when the dedicated charger for the mobile telephone 1300 is not available.

Since the diode 1321 is arranged between the antenna 16 and the capacitor 1322, the capacitor 1322 is always charged with current from the same direction to thus be effectively charged.

The radio communication device 14 emits radio waves by itself using the power stored in the capacitor 1322 to thus write information in and read information from the radio communication device. Therefore, the radio communication device 14 can emit radio waves by itself to the radio communication device that cannot emit radio waves by itself to write and read the information to thus enlarge objects in which information is written.

Since it is possible to rewrite the information concerning the mobile telephone 1300, the latest information concerning the mobile telephone 1300 is written in the radio communication device 14. Since the information can be rewritten, it is possible to reduce the chance of or prevent the region of the radio communication device 14, in which the information is written, from being filled and to rewrite and update the information an unlimited number of times.

Still another exemplary embodiment of the electronic apparatus including the liquid crystal display device according to the above exemplary embodiments will now be described with reference to FIGS. 19 and 20.

Figure 19:
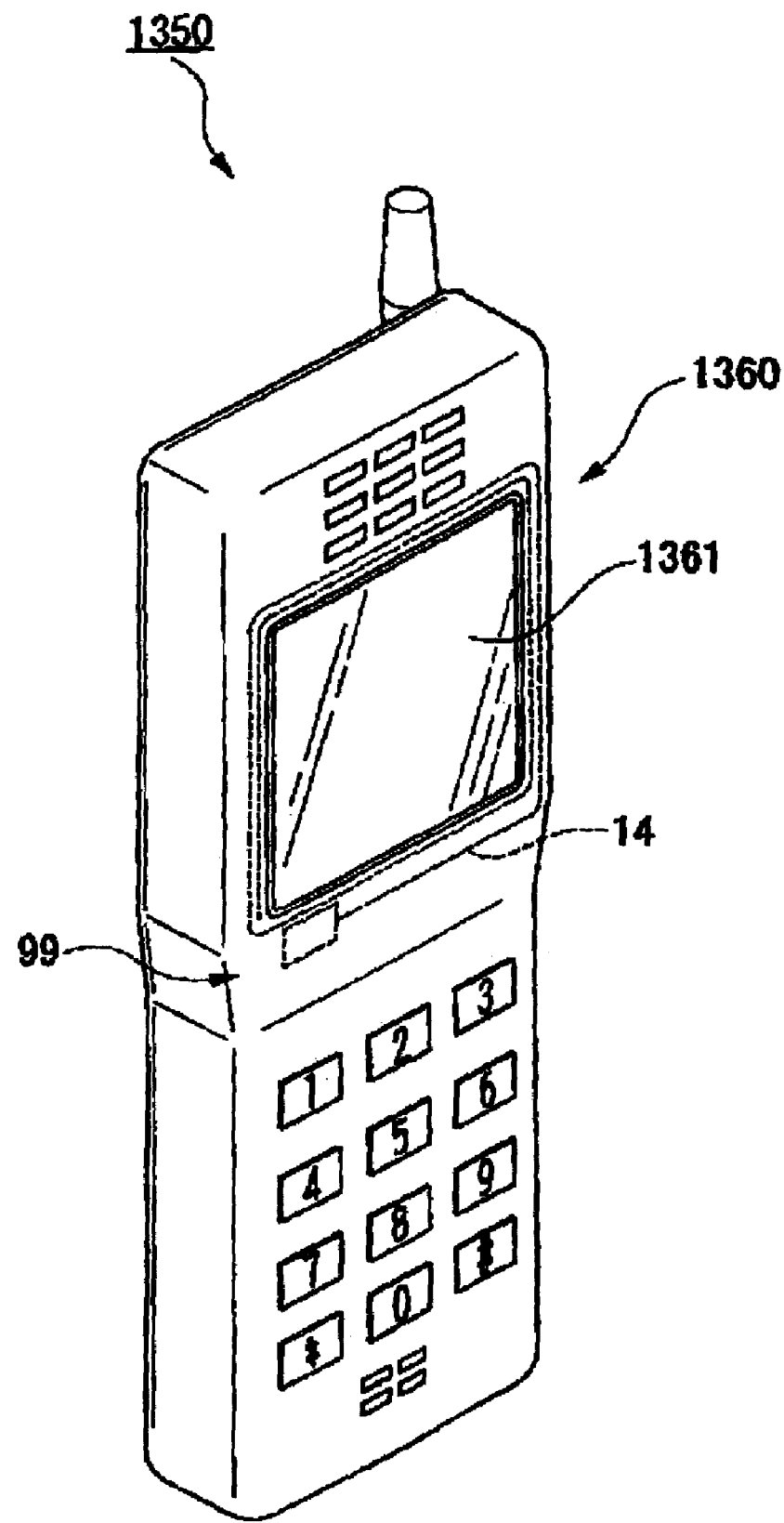
FIG. 19 is a perspective view illustrating still another example of the electronic apparatus according to an aspect of the present invention.

FIG. 19 is a perspective view of an example of a mobile telephone seen from one surface. FIG. 20 is a perspective view of a mobile telephone seen from the other surface.

Figure 20:
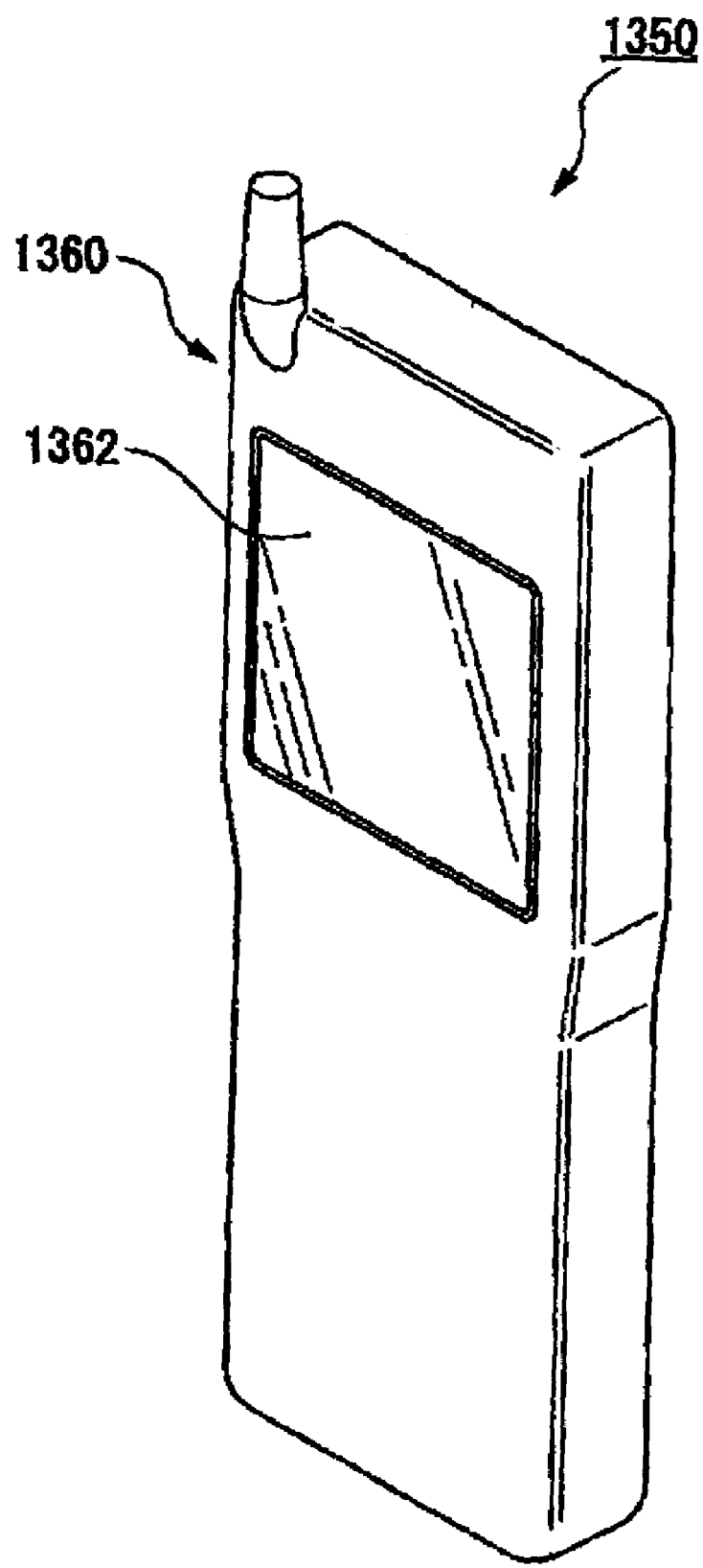
FIG. 20 is a perspective view illustrating still another example of the electronic apparatus according to an aspect of the present invention.

In FIGS. 19 and 20, the reference numeral 1350 denotes a mobile telephone (an electronic apparatus), and the reference numeral 1360 denotes a display unit (a display device), respectively.

The display unit 1360 is a translucent display device, such as an organic electroluminescent (EL) display device, in which images can be displayed on one surface 1361 and the other surface 1362 of the display unit 1360. The display unit 1360 is encased in the case of the mobile telephone 1350. Only one surface 1361 of the display unit 1360 is exposed to one surface of the mobile telephone 1350 through the window of the case. Only the other surface 1362 of the display unit 1360 is exposed to the other surface of the mobile telephone 1350 through the window of the case.

As described in the exemplary embodiment, since the radio communication device 14 of the display device is arranged in the surface of the mobile telephone 1360 outside the display unit 1360 to be hidden in the case, the user cannot directly see the radio communication device 14. Therefore, the mark 99 showing the location of the radio communication device 14 is provided around the place where the radio communication device 14 is provided. The antenna 16 of the radio communication device 14 winds around the outer circumference of the display unit 1360 several times.

In a mobile telephone 1350 according to the present exemplary embodiment, the radio communication device 14 can correctly, write information in and read information from, another radio communication device by making the surface of the mobile telephone 1350 approach the apparatus that includes the radio communication device in a state where the images displayed on the display unit 1360 are visualized from the rear face of the mobile telephone 1350.

It is possible to display the information, written in and read from, the radio communication device 14 on the display unit 1360 so as to be checked from the rear face. Therefore, it is possible to check the information, written in and read from, the radio communication device without changing the direction of the mobile telephone 1350 and to thus instantaneously check the information written in and read from the radio communication device.

Still another exemplary embodiment of the electronic apparatus that includes the liquid crystal display device according to the above exemplary embodiments will now be described with reference to FIG. 21.

Figure 21:
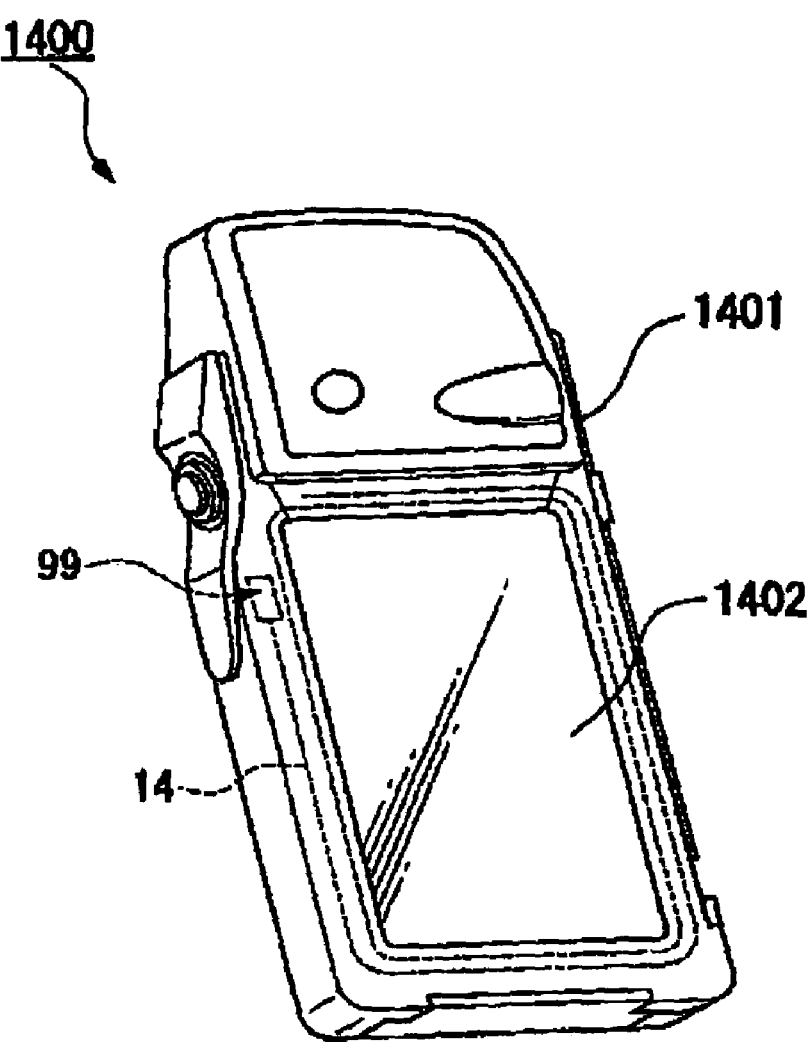
FIG. 21 is a perspective view illustrating still another example of the electronic apparatus according to an aspect of the present invention.

FIG. 21 is a perspective view illustrating an example of a portable information processing device, such as a hybrid PDA (personal digital assistance).

In FIG. 21, the reference numeral 1400 denotes a hybrid PDA (an electronic apparatus), the reference numeral 1401 denotes the main body of the hybrid PDA, and the reference numeral 1402 denotes a liquid crystal display unit using the liquid crystal display device, respectively.

The liquid crystal display device according to the above exemplary embodiments is encased in the case of the hybrid PDA 1400. Only the liquid crystal display unit 1402 is exposed through the window of the case. As described in the above exemplary embodiments, since the radio communication device 14 of the liquid crystal display device is arranged outside the liquid crystal display unit 1402 to thus be hidden in the case, the user cannot directly see the radio communication device 14. Therefore, the mark 99 showing the location of the radio communication device 14 is provided around the place where the radio communication device 14 is provided. The antenna 16 of the radio communication device 14 winds around the outer circumference of the liquid crystal display unit 1402 several times.

The scope of the present invention is not limited to the above exemplary embodiments and various changes in form and details may be made therein without departing from the spirit and scope of the present invention. For example, the active matrix liquid crystal display device is described in the above exemplary embodiments. However, it is possible to form the radio communication device in a passive matrix liquid crystal display device. Further, it is possible to apply the present invention to display devices, such as a plasma display panel (PDP), a field emission display (FED) and a fluorescent display tube, as well as the liquid crystal display device. In the PDP, an antenna is preferably formed together with an address electrode, a bus electrode, and a display electrode by the same process. In the FED, an antenna is preferably formed together with a gate electrode and a cathode by the same process. In the fluorescent display tube, an antenna is preferably formed together with an anode by the same process.

What is claimed is:

1. A display device, comprising:
at least one substrate provided with a display unit and display-unit-driving wiring lines, at least one of the display unit and the display-unit-driving wiring lines including a conductor layer formed on the substrate from a conductive material in a conductor forming process; and
a radio communication device having a communication integrated-circuit unit and an antenna, the communication integrated-circuit unit being mounted on the substrate, at least a part of the antenna being formed on the substrate in the same conductor layer and from the same conductive material as the conductor layer of the at least one of the display unit and the display-unit-driving wiring lines, the communication integrated-circuit unit and the antenna being electrically connected to each other by the conductor layer of the at least one of the display unit and the display-unit-driving wiring lines.

2. The display device according to claim 1, the radio communication device having a function of storing information concerning the corresponding display device.

3. The display device according to claim 1, the radio communication device having at least one of a function of writing information in a radio communication device other than the corresponding display device and a function of reading information from the radio communication device other than the corresponding display device.

4. The display device according to claim 1, the radio communication device having a function of storing at least one of information written in a radio communication device other than the corresponding display device and information of the radio communication device other than the corresponding display device.

5. The display device according to claim 1, an external substrate for driving the display unit electrically connected to the substrate and a conductor provided on the external substrate electrically connected to the antenna formed on the substrate so that the conductor on the external substrate and the antenna on the substrate include an entire antenna, and
the communication integrated-circuit unit is mounted on the external substrate.

6. The display device according to claim 5, the external substrate including of a plurality of external substrates, and the communication integrated-circuit unit is mounted on one of the plurality of external substrates.

7. The display device according to claim 1, the communication integrated-circuit unit includes of a plurality of semiconductor elements formed on the substrate.

8. The display device according to claim 7, the plurality of semiconductor elements that include the communication integrated circuit has the same structure as another semiconductor element formed on the substrate.

9. The display device according to claim 1, at least a part of the antenna formed on the substrate in a region excluding the display unit.

10. The display device according to claim 9, at least a part of the antenna formed along one peripheral edge of the substrate.

11. The display device according to claim 1, the conductor formed above the antenna on the substrate to include the corresponding display device does not overlap the antenna in plan view.

12. An electronic apparatus, comprising:
the display device according claim 1.

13. An electronic apparatus, comprising:
the display device according to claim 1 and a charging unit electrically connected to the antenna of the radio communication device through a rectifying unit to control the flow of the current in one direction, the antenna is used as an antenna to charge power into the charging unit from the outside using electromagnetic induction.

14. The electronic apparatus according to claim 13, further comprising:
another apparatus excluding the display device electrically connected to the charging unit,
the other apparatus driven by the power charged in the charging unit.

15. An electronic apparatus, comprising:
a first display device and a second display device,
the second display device being the display device according to claim 1 and provided on the surface opposite to the surface on which the first display device is provided.

16. The electronic apparatus according to claim 15, the first display device displaying at least one of information written in a radio communication device other than the corresponding display device by the second display device and information read from the radio communication device other than the corresponding display device by the second display device.

17. The electronic apparatus according to claim 15, the first display device storing and displaying at least one of information written in a radio communication device other than the corresponding display device by the second display device and information read from the radio communication device other than the corresponding display device by the second display device.

18. An electronic apparatus, comprising:
the display device according to claim 1, the display device displaying at least one of the information written in a radio communication device other than the corresponding display device and the information read from the radio communication device other than the corresponding display device.

19. An electronic apparatus, comprising:
the display device according to claim 1, the display device storing and displaying at least one of information written in a radio communication device other than the corresponding display device and information read from the radio communication device other than the corresponding display device.

20. The electronic apparatus according to claim 18, at least a part of one surface and the other surface of the display device exposed to the outside.

21. The electronic apparatus according to claim 18, the display device being a display device capable of displaying images on any of the one surface and the other surface of the display device.

22. The electronic apparatus according to claim 12, the radio communication device other than the corresponding display device reading information concerning the corresponding electronic apparatus from the radio communication device and writing information concerning the corresponding electronic apparatus in the radio communication device as data.

23. The electronic apparatus according to claim 22, the radio communication device driven by radio waves input to the antenna from the outside.

24. The electronic apparatus according to claim 22 further comprising:
a power source unit electrically connected to the radio communication device,
the radio communication device being driven by the power of the power source unit.

25. The electronic apparatus according to claim 12, the information concerning the corresponding electronic apparatus being rewritten in the radio communication device as data.

26. The electronic apparatus according to claim 25, the radio communication device includes a writing unit to write information concerning the corresponding electronic apparatus as data, and
a rewritable region and a non-rewritable region are provided in the writing unit.

27. The display device according to claim 1, wherein the communication integrated-circuit unit and the antenna are formed in the same process.

28. The display device according to claim 1, the conductor layer that electrically connects the communication integrated-circuit unit and the antenna including a layer that is different from a conductor that configures at least a portion of the antenna.

* * * * *